(12) United States Patent
Go

(10) Patent No.: US 12,288,796 B2
(45) Date of Patent: Apr. 29, 2025

(54) SEMICONDUCTOR DEVICE AND IMAGE SENSOR INCLUDING THE SAME

(71) Applicant: SAMSUNG ELECTRONICS CO., LTD., Suwon-si (KR)

(72) Inventor: Jonghyun Go, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 521 days.

(21) Appl. No.: 17/519,750

(22) Filed: Nov. 5, 2021

(65) Prior Publication Data

US 2022/0238570 A1 Jul. 28, 2022

(30) Foreign Application Priority Data

Jan. 27, 2021 (KR) .................. 10-2021-0011511

(51) Int. Cl.
*H01L 27/146* (2006.01)
*H01L 29/423* (2006.01)

(52) U.S. Cl.
CPC .... *H01L 27/1463* (2013.01); *H01L 27/14603* (2013.01); *H01L 27/14621* (2013.01); *H01L 27/14623* (2013.01); *H01L 27/14636* (2013.01); *H01L 27/14681* (2013.01); *H01L 29/4236* (2013.01)

(58) Field of Classification Search
CPC ........... H01L 27/1463; H01L 27/14603; H01L 27/14621; H01L 27/14623; H01L 27/14636; H01L 27/14681; H01L 29/4236; H01L 27/14614; H01L 27/14689; H01L 27/14616; H01L 27/14605; H01L 27/14618; H01L 27/14627; H01L 27/14612
See application file for complete search history.

(56) References Cited

U.S. PATENT DOCUMENTS 6,040,607 A 3/2000 Wristers et al.
7,250,647 B2 7/2007 Rhodes
(Continued)

FOREIGN PATENT DOCUMENTS

JP 2013045879 A 3/2013
JP 2019192664 A 10/2019
(Continued)

*Primary Examiner* — Vu A Vu
*Assistant Examiner* — Jeremy Daniel Watts
(74) *Attorney, Agent, or Firm* — Sughrue Mion, PLLC

(57) ABSTRACT

Disclosed are a semiconductor device and an image sensor including the same. The semiconductor device includes a device isolation layer defining an active region on a semiconductor substrate, a gate electrode crossing the active region, a gate insulating pattern between the gate electrode and the semiconductor substrate, a first impurity region provided at a first side of the gate electrode in the active region, and a second impurity region provided at a second side of the gate electrode in the active region, and the gate insulating pattern includes a first edge portion adjacent to a first sidewall of the device isolation layer, a second edge portion adjacent to a second sidewall of the device isolation layer, and a center portion between the first and second edge portions, and the first edge portion has a first thickness, and the second edge portion has a second thickness smaller than the first thickness.

17 Claims, 32 Drawing Sheets

(56) References Cited

U.S. PATENT DOCUMENTS

| | | | |
|---|---|---|---|
| 7,846,758 B2 * | 12/2010 | Ohkawa | H01L 27/14623 |
| | | | 438/57 |
| 8,471,316 B2 | 6/2013 | Tai et al. | |
| 8,796,748 B2 | 8/2014 | Ramberg et al. | |
| 8,933,492 B2 | 1/2015 | Kurjanowicz | |
| 9,123,572 B2 | 9/2015 | Kurjanowicz | |
| 9,257,463 B2 | 2/2016 | Tseng et al. | |
| 9,466,715 B2 * | 10/2016 | Cheng | H01L 21/823462 |
| 9,543,349 B2 | 1/2017 | Oh et al. | |
| 9,887,234 B2 * | 2/2018 | Kao | H01L 27/146 |
| 9,947,701 B2 | 4/2018 | Liang et al. | |
| 10,050,115 B2 | 8/2018 | Brown et al. | |
| 10,497,787 B2 | 12/2019 | Edwards et al. | |
| 10,629,640 B2 | 4/2020 | Bairo | |
| 10,727,300 B2 | 7/2020 | Kim et al. | |
| 2006/0148139 A1 | 7/2006 | Ng et al. | |
| 2013/0049084 A1 * | 2/2013 | Saka | H01L 27/14616 |
| | | | 438/282 |
| 2013/0175590 A1 | 7/2013 | Kim | |
| 2015/0364522 A1 * | 12/2015 | Itahashi | H01L 27/14689 |
| | | | 438/59 |
| 2017/0104021 A1 * | 4/2017 | Park | H01L 27/14614 |
| 2017/0200759 A1 * | 7/2017 | Ihara | H01L 27/14643 |
| 2019/0148548 A1 | 5/2019 | Kao | |
| 2019/0326393 A1 | 10/2019 | Masunaga et al. | |
| 2023/0197753 A1 * | 6/2023 | Iwabuchi | H01L 27/14636 |
| | | | 257/446 |
| 2023/0246043 A1 * | 8/2023 | Takayanagi | H01L 27/1463 |
| | | | 257/428 |

FOREIGN PATENT DOCUMENTS

| | | |
|---|---|---|
| KR | 1020070089495 A | 8/2007 |
| KR | 1020090079105 A | 7/2009 |

* cited by examiner

SEMICONDUCTOR DEVICE AND IMAGE SENSOR INCLUDING THE SAME

CROSS-REFERENCE TO RELATED APPLICATIONS

This application claims priority from Korean Patent Application No. 10-2021-0011511 filed on Jan. 27, 2021, in the Korean Intellectual Property Office, the disclosure of which is incorporated herein by reference in its entirety.

BACKGROUND

1. Field

Embodiments of the present disclosure described herein relate to a semiconductor device with improved electrical characteristics and an image sensor including the same.

2. Description of the Related Art

An image sensor converts an optical image into an electrical signal. In recent years, with development of computer industry and communication industry, demand for the image sensor with improved performance in various fields, such as a digital camera, a camcorder, a personal communication system (PCS), a game device, a security camera, and a medical micro camera, has been increased.

The image sensor includes a charge coupled device (CCD) and a complementary metal-oxide semiconductor (CMOS) image sensor. Among them, the CMOS image sensor has a simple driving method and is capable of integrating a signal processing circuit on a single chip to enable a product to be easily downsized. The CMOS image sensor also consumes very little power, and thus it is easy to apply to a product with a limited battery capacity. In addition, the CMOS image sensor may be used interchangeably with a CMOS process technology, thereby lowering manufacturing costs. Therefore, a use of the CMOS image sensor is rapidly increased as a high resolution is capable of being implemented with development of related technologies.

SUMMARY

Embodiments provide a semiconductor device with improved electrical characteristics.

Embodiments provide an image sensor with improved electrical characteristics and optical characteristics.

The problem to be solved by the present inventive concepts is not limited to the problems mentioned above, and other problems that are not mentioned will be clearly understood by those skilled in the art from the following description.

According to an embodiment, a semiconductor device may include a device isolation layer defining an active region on a semiconductor substrate, a gate electrode crossing the active region, a gate insulating pattern between the gate electrode and the semiconductor substrate, a first impurity region provided at a first side of the gate electrode in the active region, and a second impurity region provided at a second side of the gate electrode in the active region, and the gate insulating pattern may include a first edge portion adjacent to a first sidewall of the device isolation layer, a second edge portion adjacent to a second sidewall of the device isolation layer, and a center portion between the first and second edge portions, and the first edge portion may have a first thickness, and the second edge portion may have a second thickness smaller than the first thickness.

According to an embodiment, an image sensor may include a semiconductor substrate of a first conductivity type, a pixel isolation structure provided in the semiconductor substrate to define a pixel region, a device isolation layer provided in the semiconductor substrate of the pixel region to define an active region, a photoelectric conversion region provided in the pixel region and including impurities of a second conductivity type, a floating diffusion region spaced from the photoelectric conversion region and provided in the pixel region, a transfer gate electrode between the photoelectric conversion region and the floating diffusion region, and transistors connected to the floating diffusion region, at least one of the transistors may include a gate electrode disposed on the active region, a gate insulating pattern between the gate electrode and the active region, and first and second impurity regions provided in the active region at both sides of the gate electrode, the gate insulating pattern may include first and second edge portions opposite to each other and adjacent to the device isolation layer, and a center portion between the first and second edge portions, and the first edge portion may have a first thickness, and the second edge portion may have a second thickness smaller than the first thickness.

According to an embodiment, an image sensor may include a semiconductor substrate of a first conductivity type having a first surface and a second surface facing each other, a pixel isolation structure disposed in the semiconductor substrate to define first and second pixel regions, photoelectric conversion regions of a second conductivity type provided to the first and second pixel regions, respectively, a transfer gate electrode disposed on the first surface of the semiconductor substrate in each of the first and second pixel regions, a first device isolation layer defining a first active region on the first surface of the semiconductor substrate in the first pixel region, a source follower gate electrode disposed on the first active region, a first gate insulating pattern between the source follower gate electrode and the first active region, interconnections electrically connected to the photoelectric conversion regions on the first surface of the semiconductor substrate, color filters corresponding to the first and second pixel regions on the second surface of the semiconductor substrate, and micro lenses on the color filters, the first active region may include a channel region overlapping the source follower gate electrode, and the channel region includes a first edge region adjacent to a first sidewall of the first device isolation layer, a second edge region adjacent to a second sidewall of the first device isolation layer, and an effective channel region between the first edge region and the second edge region, and the first gate insulating pattern may include a first edge portion having a first thickness and overlapping the first edge region, and a second edge portion having a second thickness smaller than the first thickness and overlapping the second edge region.

BRIEF DESCRIPTION OF DRAWINGS

The above and other objects and features will become apparent by describing in detail embodiments thereof with reference to the accompanying drawings.

DETAILED DESCRIPTION

The embodiments described herein are all example embodiments, and thus, the inventive concept is not limited thereto and may be realized in various other forms. Each of the embodiments provided in the following description is not excluded from being associated with one or more features of another example or another embodiment also provided herein or not provided herein but consistent with the inventive concept. For example, even if matters described in a specific example are not described in a different example thereto, the matters may be understood as being related to or combined with the different example, unless otherwise mentioned in descriptions thereof. In addition, it should be understood that all descriptions of principles, aspects, examples, and specific embodiments of the inventive concept are intended to encompass structural and functional equivalents thereof.

Hereinafter, a semiconductor device and a method of manufacturing the same according to embodiments will be described in detail with reference to the drawings.

Figure 1:
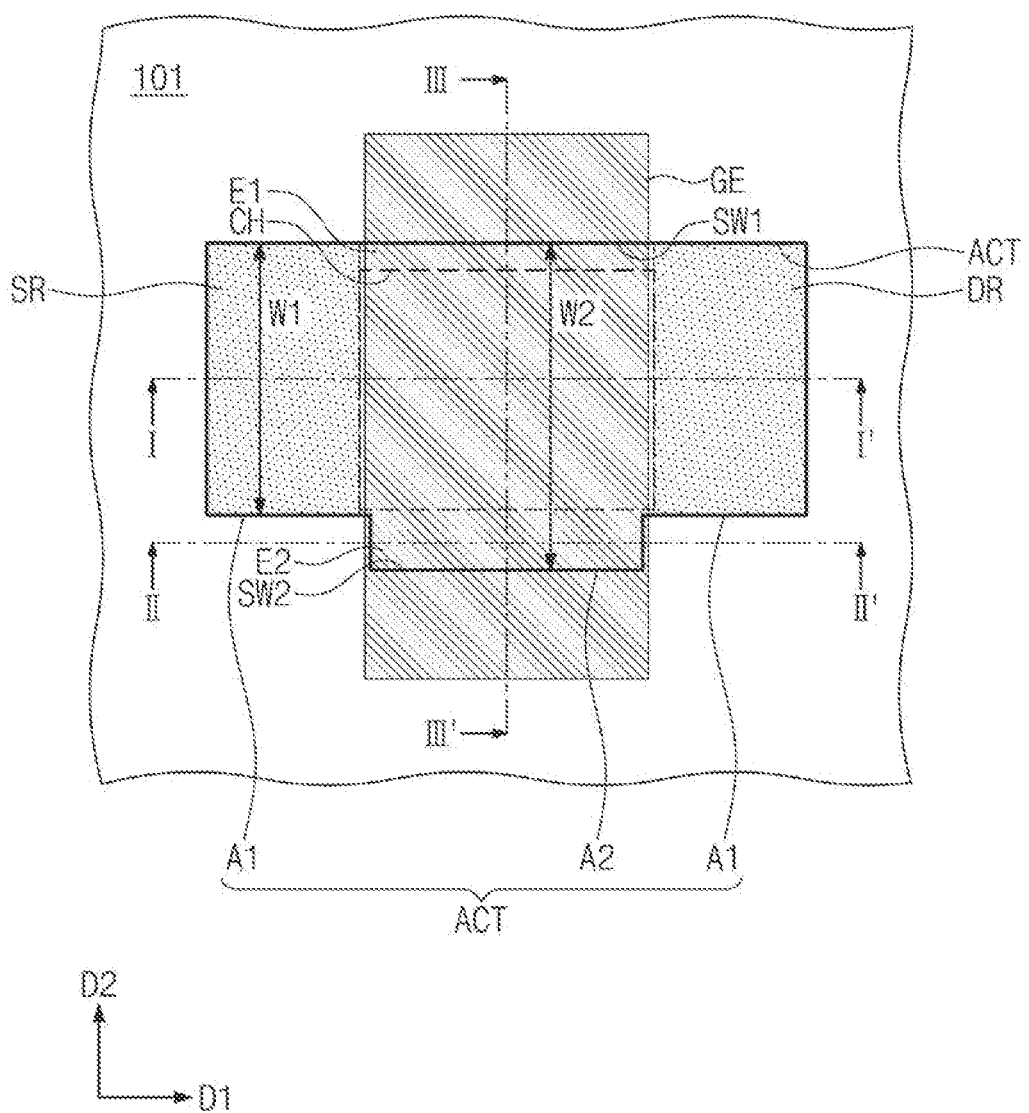
FIG. 1 is a plan view illustrating a part of a semiconductor device according to embodiments.
Figure 2:
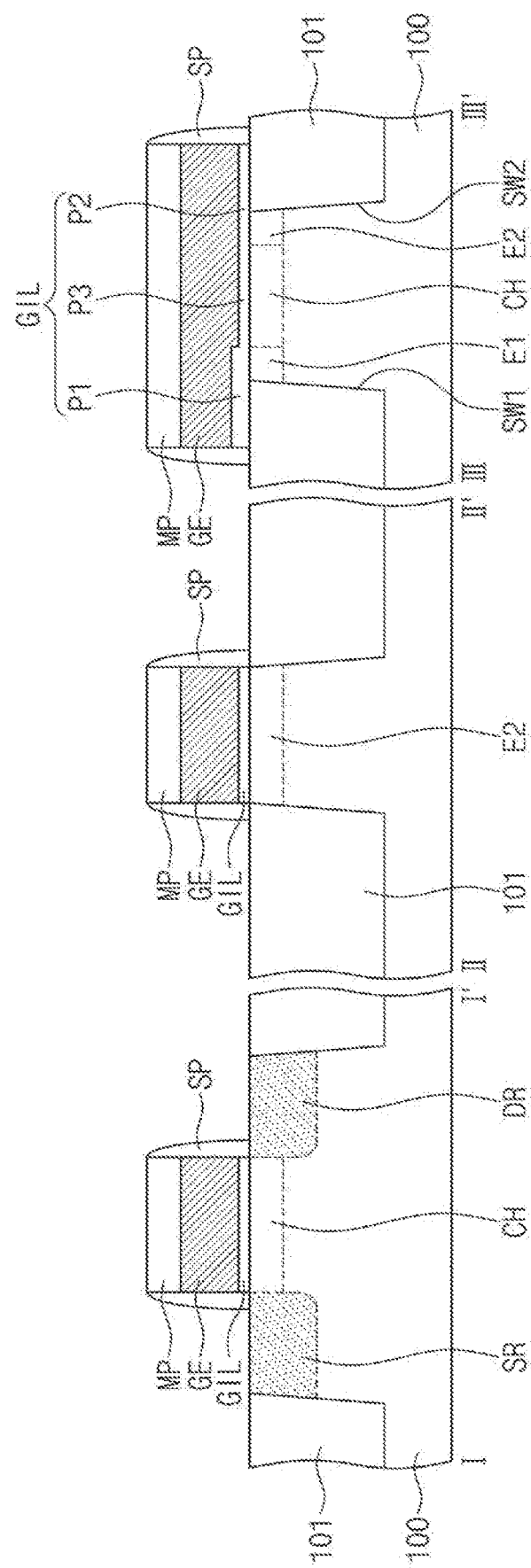
FIG. 2 is a cross-sectional view taken along lines I-I', II-II' and III-III' of FIG. 1.

FIG. 1 is a plan view illustrating a part of a semiconductor device according to embodiments. FIG. 2 is a cross-sectional view taken along lines I-I', II-II', and III-III' of FIG. 1.

Referring to FIGS. 1 and 2, a device isolation layer 101 defining an active region ACT may be provided in a semiconductor substrate 100.

The semiconductor substrate 100 may be formed of one of a material having semiconductor properties (e.g., a silicon wafer), an insulating material (e.g., glass), a semiconductor or a conductor covered by an insulating material. The semiconductor substrate 100 may be a silicon substrate, a germanium substrate, a silicon on insulator (SOI) substrate, or a germanium on insulator (GOI) substrate. For example, the semiconductor substrate 100 may be a silicon wafer having a first conductivity type.

The semiconductor substrate 100 may include an n-type or p-type well impurity layer (not shown), and the device isolation layer 101 may be provided in the well impurity layer. The device isolation layer 101 may be formed of an insulating material. The device isolation layer 101 may also be referred to as a shallow trench isolation (STI) layer.

The active region ACT may have a lengthwise axis in a first direction D1 and a widthwise axis in a second direction D2. The active region ACT may include first portions A1 each having a first width W1 in the second direction D2 and a second portion A2 having a second width W2 greater than the first width W1 in the second direction D2. The first portions A1 may be spaced from each other in the first direction D1, and the second portion A2 may be provided between the first portions A1.

The device isolation layer 101 may have a first sidewall SW1 and a second sidewall SW2 opposite to the first sidewall SW1 in the second direction D2. A distance between the first and second sidewalls SW1 and SW2 of the device isolation layer 101 in each of the first portions A1 of the active region ACT may be smaller than that in the second portion A2 of the active region ACT. The first width W1 or the second width W2 of the active region ACT may correspond to a distance between the first sidewall SW1 and the second sidewall SW2 of the device isolation layer 101.

The first sidewall SW1 of the device isolation layer 101 in the first portion A1 of the active region ACT may be aligned with the sidewall SW1 in the second portion A2 of the active region ACT. The second sidewall SW2 of the device isolation layer 101 in the first portions A1 may be offset from the second sidewall SW2 of the device isolation layer in the second portion A2. The first sidewall SW1 and the second sidewall SW2 of the device isolation layer 101 may be asymmetric with each other. That is, the active region ACT may have an asymmetric shape.

A gate electrode GE and a hard mask pattern MP may be sequentially stacked on the active region ACT of the semiconductor substrate 100. The gate electrode GE may extend across the second portion A2 of the active region ACT.

The gate electrode GE may include, for example, doped polysilicon, a metal, a conductive metal nitride, a conductive metal silicide, a conductive metal oxide, or a combination thereof. The gate electrode GE may be doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto. The gate electrode GE may include a single layer or multiple layers of the above-described materials. For example, the gate electrode GE may include a doped polysilicon pattern, a metal silicide pattern, and/or a metal pattern.

The hard mask pattern MP may include a silicon nitride film or a silicon oxynitride film. In some embodiments, the hard mask pattern MP may be omitted.

A gate insulating pattern GIL may be disposed between the gate electrode GE and the semiconductor substrate 100. The gate insulating pattern GIL may overlap the gate electrode GE.

The gate insulating pattern GIL may include first and second edge portions P1 and P2 which face each other and are adjacent to the device isolation layer 101, and a center portion P3 between the first and second edge portions P1 and P2. The first edge portion P1 of the gate insulating pattern GIL may have a first thickness, and the second edge portion P2 and the center portion P3 of the gate insulating pattern GIL may have a second thickness smaller than the first thickness.

The gate insulating pattern GIL may be formed of a silicon oxide layer, a silicon oxynitride layer, a high dielectric film having a higher dielectric constant than that of the silicon oxide layer, or a combination thereof. The high dielectric film may be formed of a metal oxide or a metal oxynitride. For example, the high dielectric layer usable as the gate insulating pattern GIL may be formed of HfO2, HfSiO, HfSiON, HfTaO, HfTiO, HfZrO, $ZrO_2$, $Al_2O_3$, or a combination thereof, but is not limited thereto.

First and second impurity regions SR and DR may be provided in the active region ACT at both sides of the gate electrode GE. The first and second impurity regions SR and DR may include impurities of a second conductivity type doped in the semiconductor substrate 100 of the first conductivity type.

The first and second impurity regions SR and DR may be spaced from each other in the first direction D1 in the active region ACT, and a channel region may be provided between the first and second impurity regions SR and DR in the first direction D1.

According to embodiments, the channel region (i.e., the second portion A2 of the active region ACT) may include a first edge region E1 adjacent to the first sidewall SW1 of the device isolation layer 101, a second edge region E2 adjacent to the second sidewall SW2 of the device isolation layer 101, and an effective channel region CH between the first and second edge regions E1 and E2. Here, the first edge region E1 may overlap the first edge portion P1 of the gate insulating pattern GIL, and the second edge region E2 may overlap the second edge portion P2. The effective channel region CH may overlap the center portion P3 of the gate insulating pattern GIL.

The first edge region E1 and the effective channel region CH may be provided between the first and second impurity regions SR and DR in the first direction D1, and the second edge region E2 may be provided between parts of the device isolation layer 101 in the first direction D1.

According to embodiments, when a transistor is operated, carriers may flow from a source (the first impurity region SR) to a drain (the second impurity region DR) in a state of being spaced apart from the first and second sidewalls SW1 and SW2 of the device isolation layer 101. That is, when the transistor is operated, the current may flow through the effective channel region CH corresponding to the center portion of the channel region. Accordingly, when the transistor is operated, a situation, in which the carriers are trapped at an interface between the active region ACT and the device isolation layer 101, may be prevented or reduced while the carriers move from the source (the first impurity region SR) to the drain (the second impurity region DR) through regions adjacent to the device isolation layer 101. It is noted that this effect of improved current flow may be enabled due to the asymmetric shape of the active region ACT and the thickness difference between the first edge portion P1, the second edge portions P2 and the center portion P3 of the gate insulation pattern GIL.

Figure 3A:
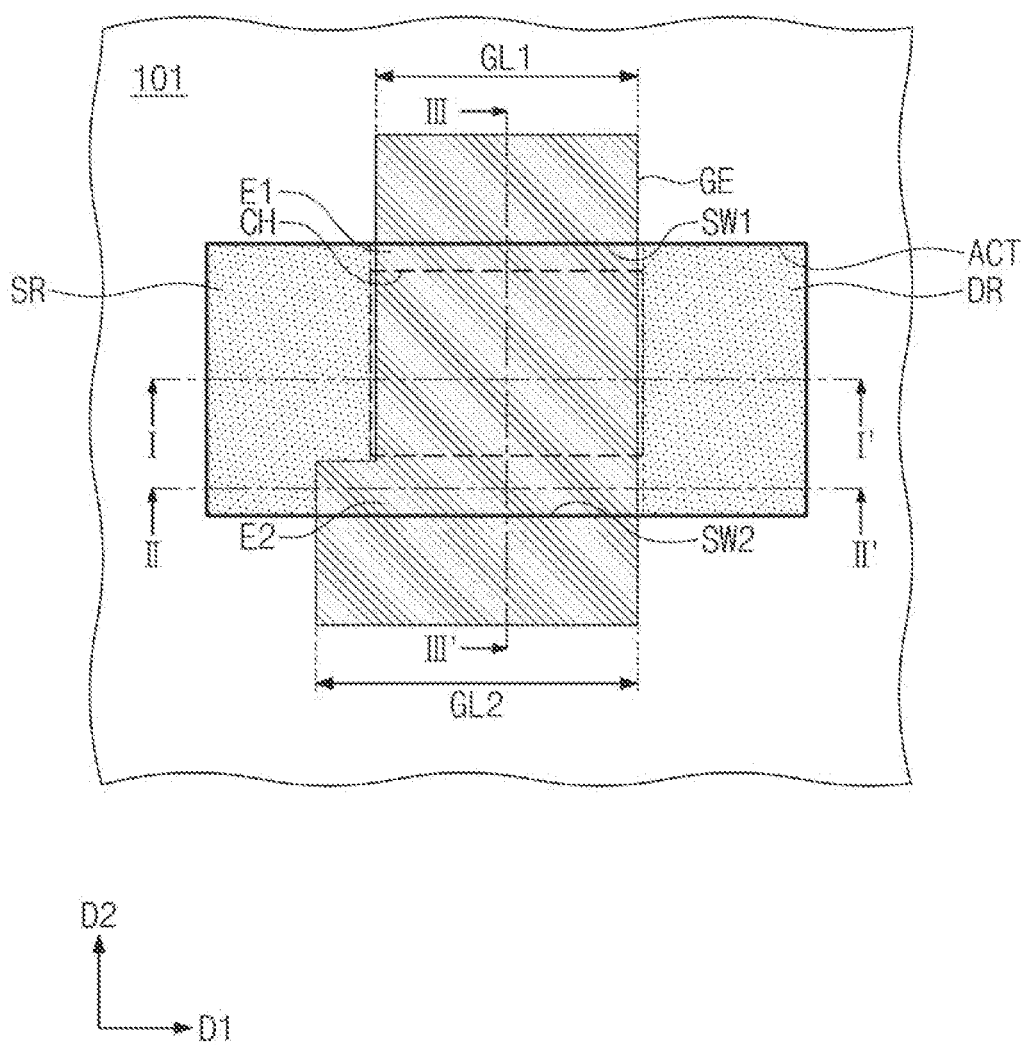
FIGS. 3A, 3B, and 3C are plan views illustrating parts of semiconductor devices according to embodiments.
Figure 3B:
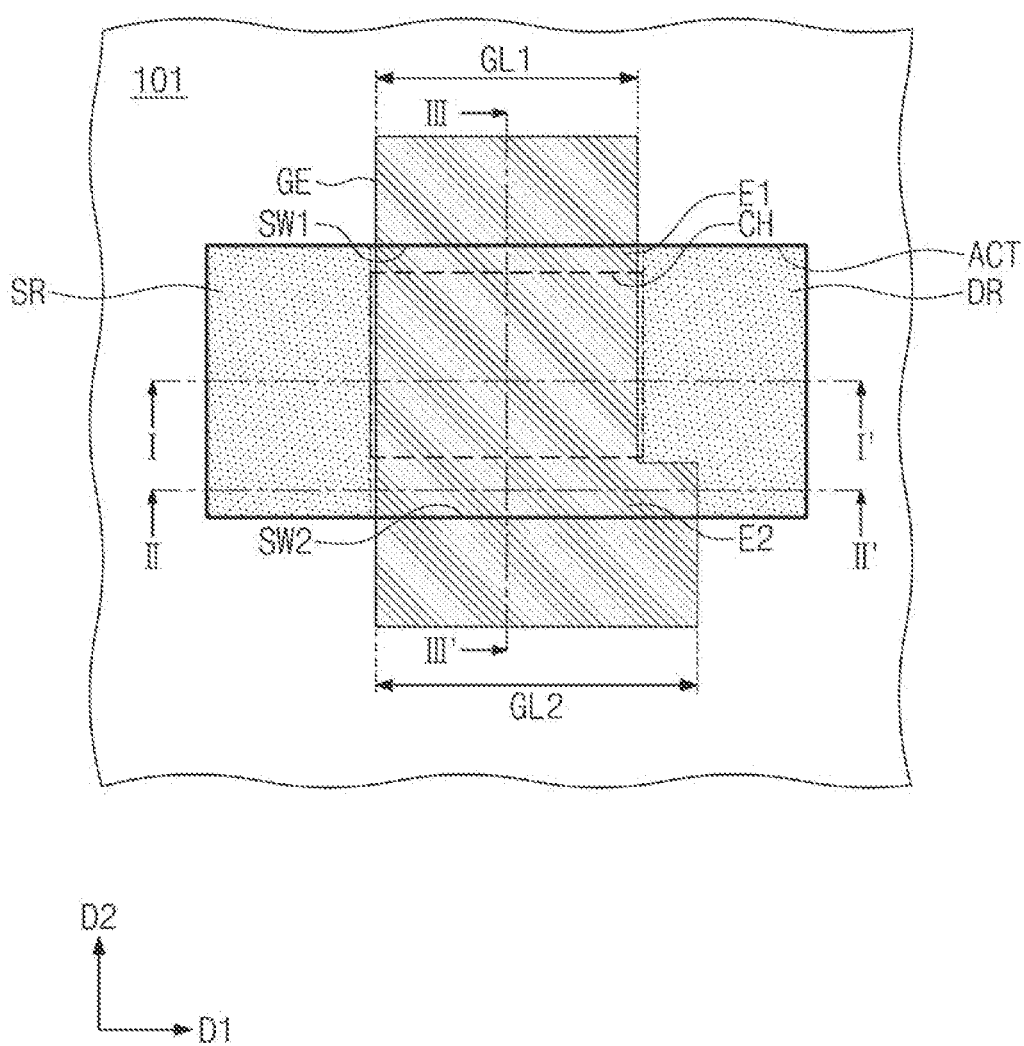
Figure 3C:
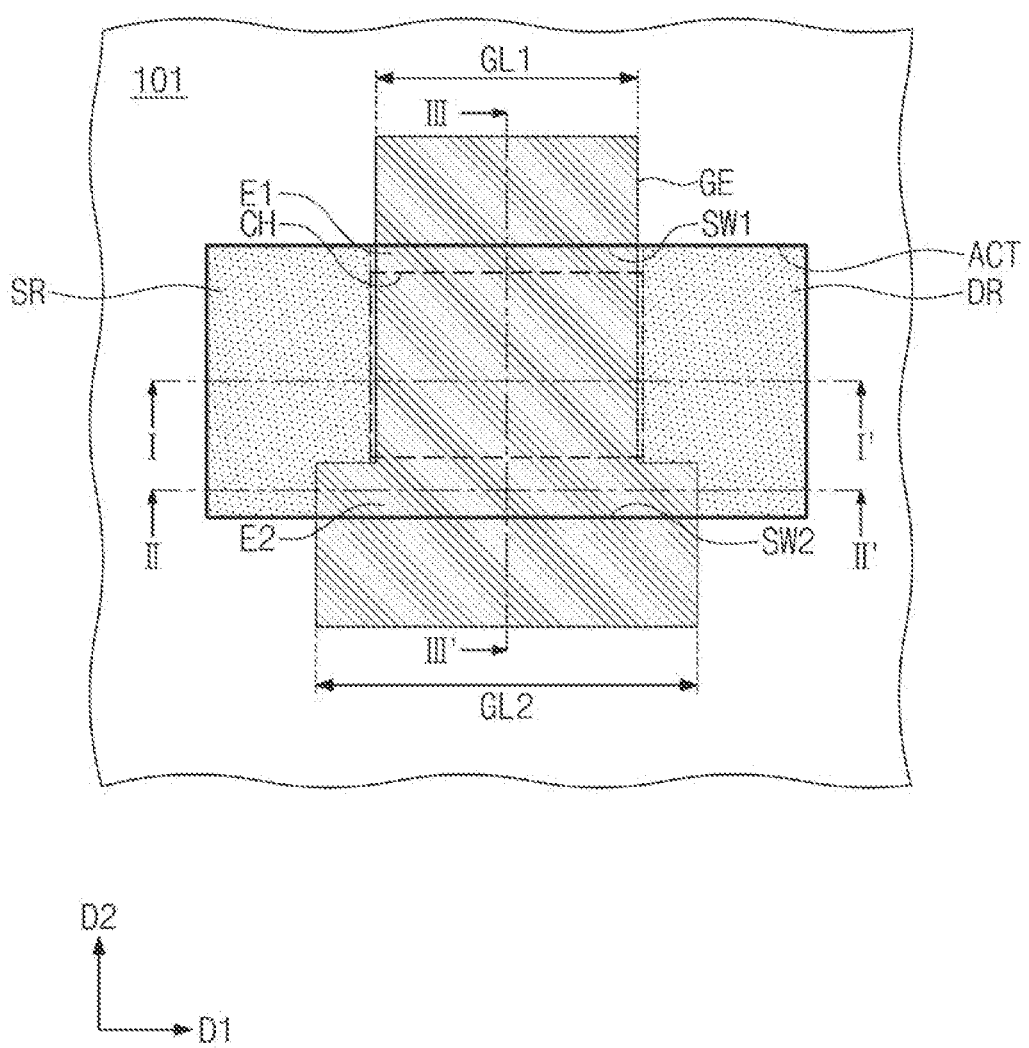
Figure 4A:
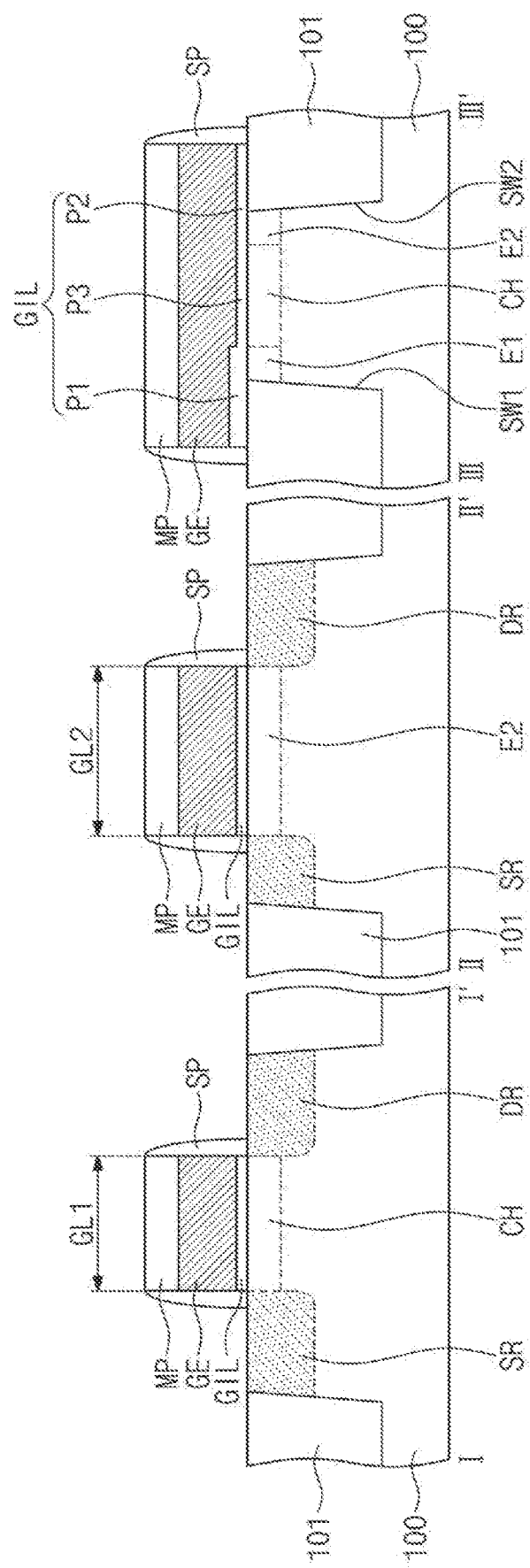
FIGS. 4A, 4B, and 4C are cross-sectional views taken along lines I-I', II-II', and III-III' of FIGS. 3A, 3B, and 3C, respectively.
Figure 4B:
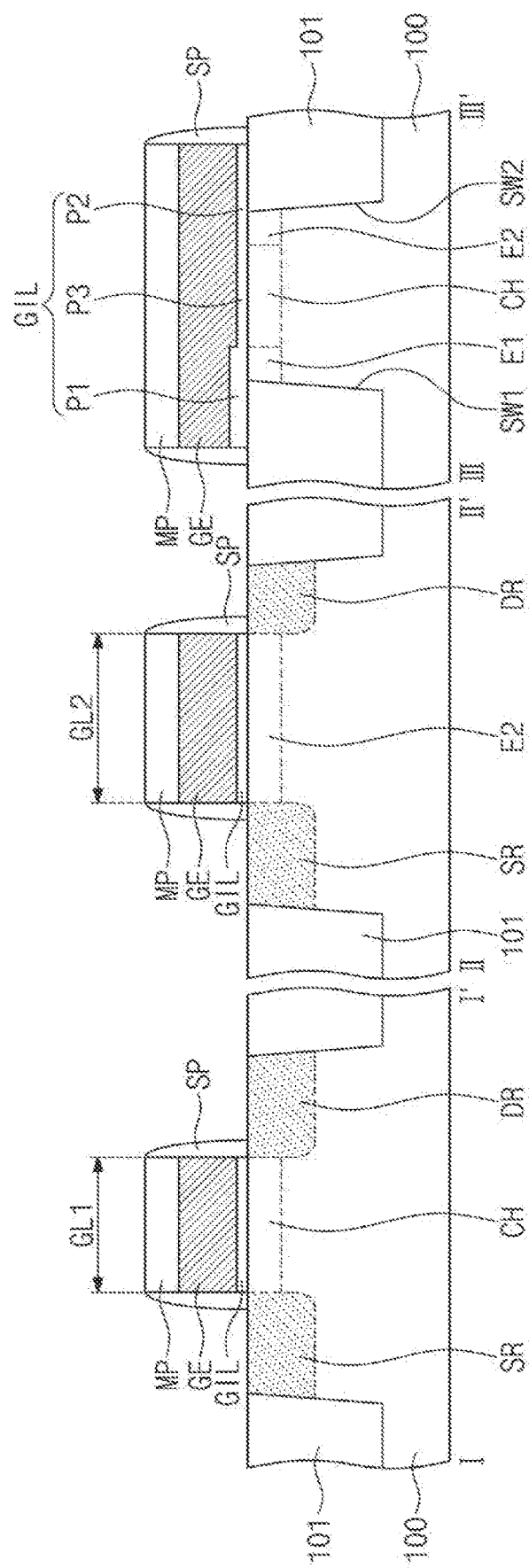
Figure 4C:
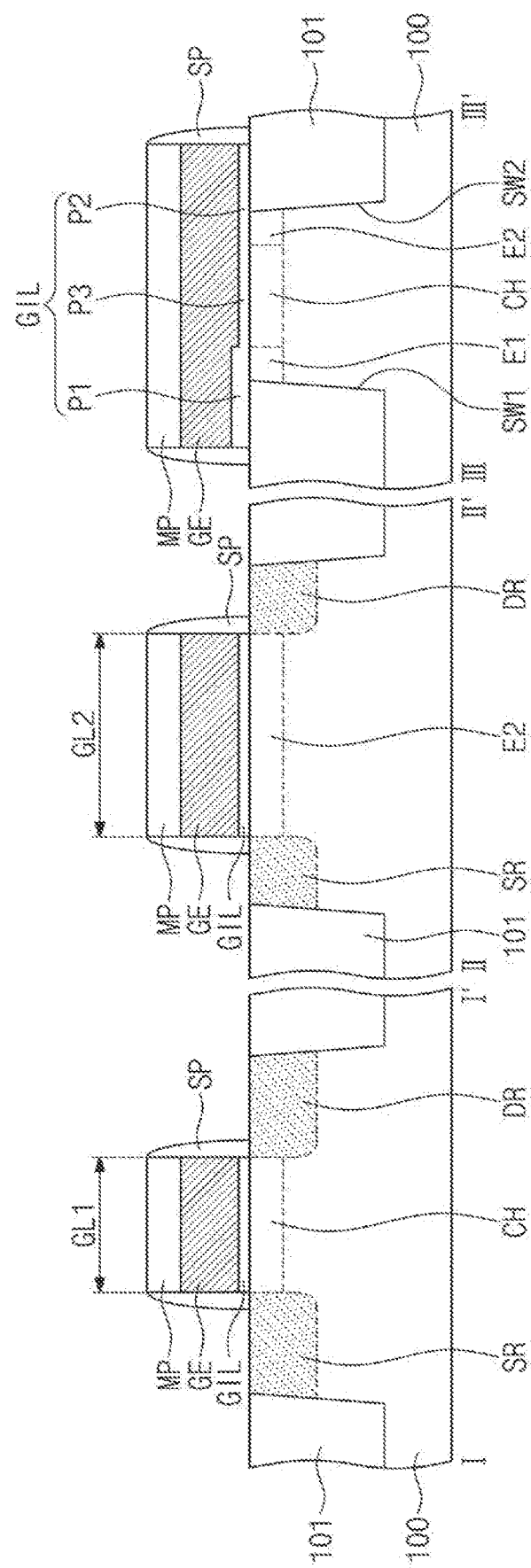

FIGS. 3A, 3B, and 3C are plan views illustrating parts of semiconductor devices according to embodiments. FIGS. 4A, 4B, and 4C are cross-sectional views taken along lines I-I', II-II', and III-III' of FIGS. 3A, 3B, and 3C, respectively.

Referring to FIGS. 3A and 4A, the device isolation layer 101 defining the active region ACT may be provided on the semiconductor substrate 100. The device isolation layer 101 may have first and second sidewalls SW1 and SW2 facing each other in the second direction D2.

The active region ACT may have the lengthwise axis in the first direction D1 and the widthwise axis in the second direction D2. In an example, the active region ACT may have a bar shape having a substantially uniform width in the second direction D2.

The gate electrode GE may be disposed on the semiconductor substrate 100 across the active region ACT, and the first and second impurity regions SR and DR may be provided at both sides of the gate electrode GE in the active region ACT.

The gate electrode GE may include a first portion having a first gate length GL1 in the first direction D1 and a second portion having a second gate length GL2 in the first direction D1, and the second gate length GL2 may be greater than the first gate length GL1. The second portion of the gate electrode GE may protrude toward the first impurity region SR in a plan view.

The gate insulating pattern GIL may be interposed between the gate electrode GE and the semiconductor substrate 100, and as described above with reference to FIGS. 1 and 2, may include the first edge portion P1 having the first thickness, the second edge portion P2 having the second thickness smaller than the first thickness, and the center portion P3 between the first and second edge portions P1 and P2.

The channel region may be provided in the active region ACT between the first and second impurity regions SR and DR. As described above, the channel region may include the first edge region E1 adjacent to the first sidewall SW1 of the device isolation layer 101, the second edge region E2 adjacent to the second sidewall SW2 of the device isolation layer 101, and the effective channel region CH between the first and second edge regions E1 and E2. The first edge region E1 of the channel region may overlap the first edge portion P1 of the gate insulating pattern GIL. The second edge region E2 of the channel region may overlap the second edge portion P2 of the gate electrode GE.

A distance between the first and second impurity regions SR and DR at both sides of the second edge region E2 may be greater than a distance between the first and second impurity regions SR and DR at both sides of the effective channel region CH. That is, in the first direction D1, a length of the second edge portion P2 of the gate insulating pattern GIL may be longer than a length of the first edge portion P1. Also, on both sides of the second edge region E2, in the first direction D1, a length of the first impurity region SR and a length of the second impurity region DR may be different. In other words, a gate length is greater in the second edge region E2 than in the effective channel region CH.

In the second edge region E2 in which the thin gate insulating pattern GIL is provided, a channel length may be longer than a length of the effective channel region CH. Accordingly, when the transistor is operated, the carriers may flow from the source to the drain through the effective channel region CH rather than the second edge region E2, thereby achieving improved current flow.

Referring to FIGS. 3B and 4B, as described above, the gate electrode GE may include the first portion having the first gate length GL1 and the second portion having the second gate length GL2, in the first direction D1, and the second portion of the gate electrode GE may protrude toward the second impurity region DR in a plan view.

That is, on the both sides of the second edge region E2, in the first direction D1, a length of the first impurity region SR may be greater than a length of the second impurity region DR. In addition, a length of the second impurity region DR may be smaller on a region adjacent to (at a right side of) the second edge region E2 than on a region adjacent to (at a right side of) the effective channel region CH.

Referring to FIGS. 3C and 4C, as described above, the gate electrode GE may include the first portion having the first gate length GL1 and the second portion having the second gate length GL2, in the first direction D1, and the second portion of the gate electrode GE may protrude toward the first and second impurity regions SR and DR in a plan view.

A length of the first impurity region SR may be smaller on a region adjacent to (at a left side of) the second edge region E2 than on a region adjacent to (at a left side of) the effective channel region CH. Also, a width of the second impurity region DR may be smaller on a region adjacent to (at a right side of) the second edge region E2 than on a region adjacent to (at a right side of) the effective channel region CH.

Here, it is noted again that the above embodiments of thickness difference in the gate insulating pattern GIL, and the gate length difference may enable improved current flow in a transistors through the effective channel region CH away from the interface of the active region ACT and the device isolation layer 101.

Figure 5:
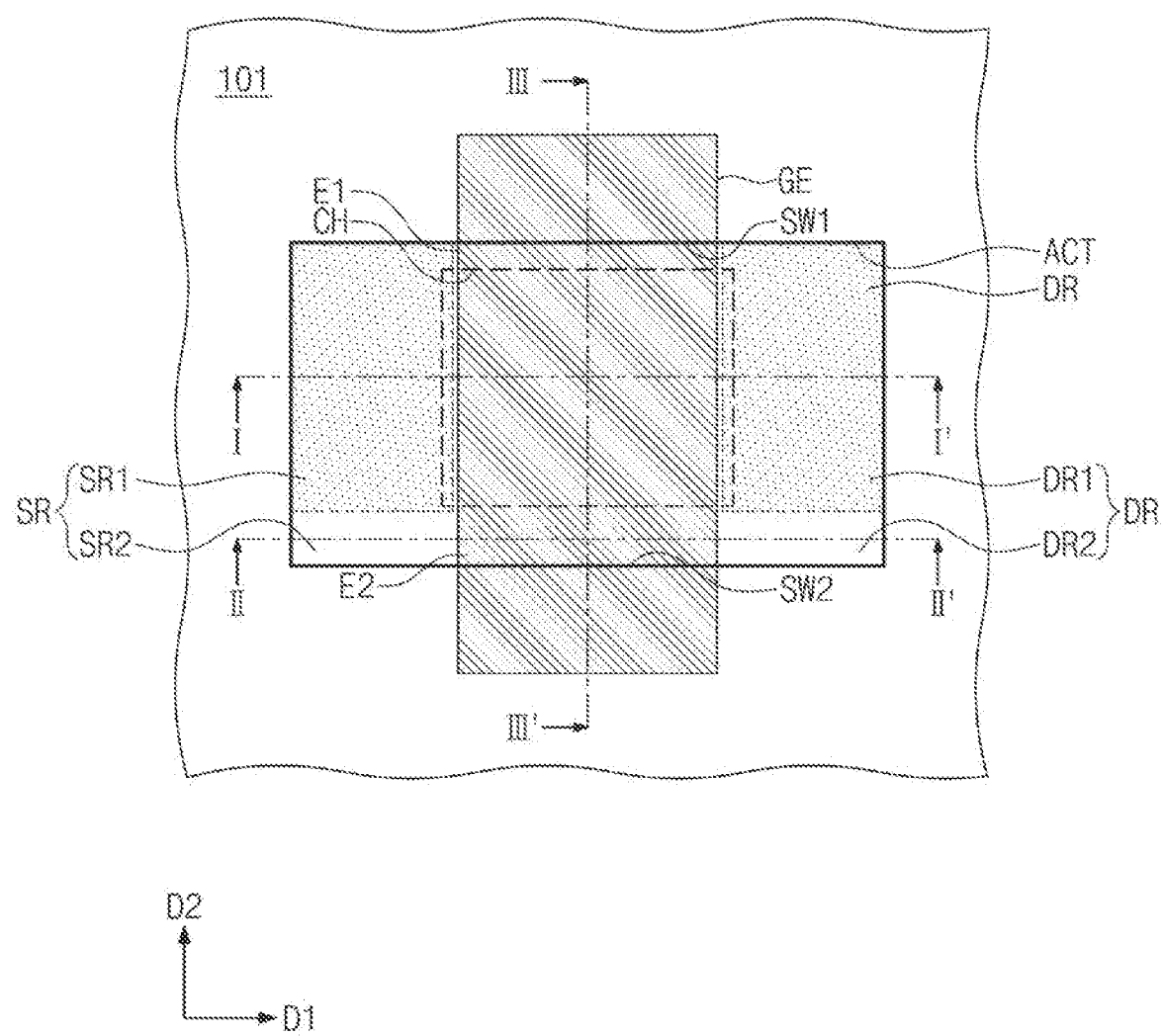
FIG. 5 is a plan view illustrating a part of a semiconductor device according to embodiments.
Figure 6:
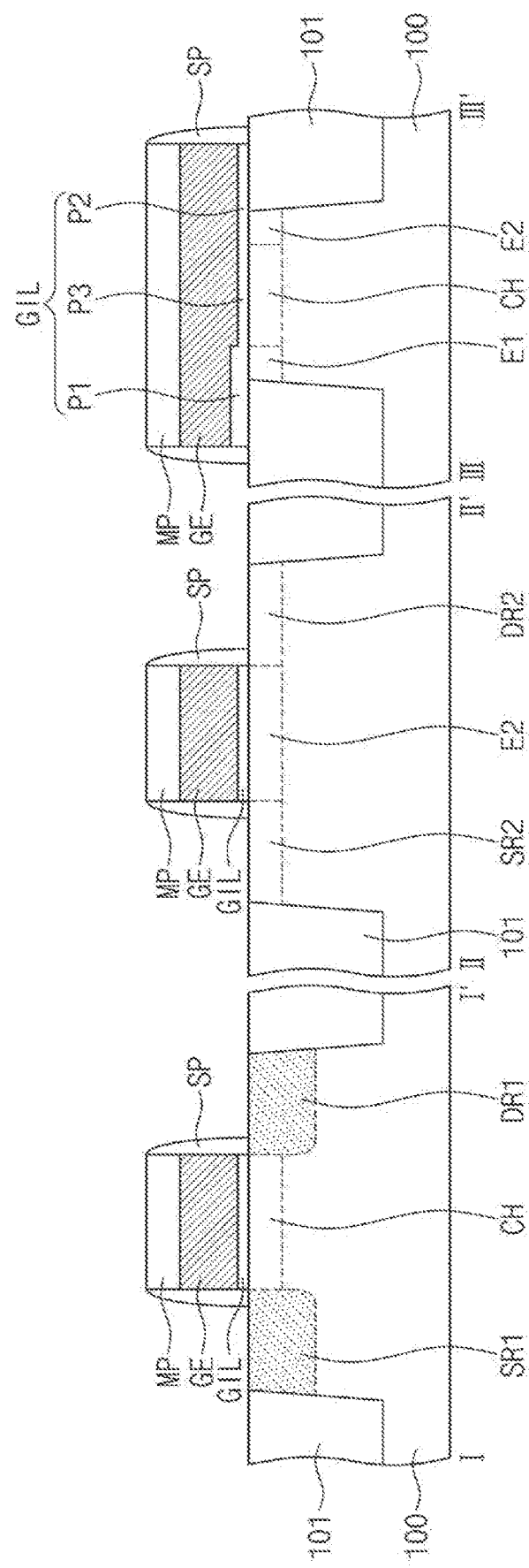
FIG. 6 is a cross-sectional view taken along lines I-I', II-II', and III-III' of FIG. 5.

FIG. 5 is a plan view illustrating a part of a semiconductor device according to embodiments. FIG. 6 is a cross-sectional view taken along lines I-I', II-II', and III-III' of FIG. 5.

Referring to FIGS. 5 and 6, the device isolation layer 101 defining the active region ACT may be provided on the semiconductor substrate 100. The device isolation layer 101 may have the first and second sidewalls SW1 and SW2 facing each other in the second direction D2.

The active region ACT may have the lengthwise axis in the first direction D1 and the widthwise axis in the second direction D2. In an example, the active region ACT may have a bar shape having a substantially uniform width in the second direction D2.

The gate electrode GE may be disposed on the semiconductor substrate 100 across the active region ACT, and the gate insulating pattern GIL may be interposed between the gate electrode GE and the semiconductor substrate 100. As described above with reference to FIGS. 1 and 2, the gate insulating pattern GIL includes the first edge portion P1 having the first thickness, the second edge portion P2 having the second thickness smaller than the first thickness, and the center portion P3 between the first and second edge portions P1 and P2.

The channel region may be provided in the active region ACT between the first and second impurity regions SR and DR. According to an embodiment, the channel region may include the first edge region E1 adjacent to the first sidewall SW1 of the device isolation layer 101, the second edge region E2 adjacent to the second sidewall SW2 of the device isolation layer 101, and the effective channel region CH between the first and second edge regions E1 and E2. The first edge region E1 of the channel region may overlap the first edge portion P1 of the gate insulating pattern GIL. The second edge region E2 of the channel region may overlap the second edge portion P2 of the gate insulating pattern GIL.

Each of the first and second impurity regions SR and DR may include first and second doped regions SR1, DR1, SR2, and DR2.

The first doped region SR1 of the first impurity region SR may be adjacent to (at a left side of) the first edge region E1 and the effective channel region CH, and the first doped region DR1 of the second impurity region DR may be adjacent to (at a right side) the first edge region E1 and the effective channel region CH.

The second doped region SR2 of the first impurity region SR may be adjacent to (at a left side of) the second edge region E2, and the second doped region DR2 of the second impurity region DR may be adjacent to (at a right side) the second edge region E2. That is, in the second direction D2, widths of the second doped regions SR2 and DR2 may be smaller than widths of the first doped regions SR1 and DR1.

According to an embodiment, the first and second doped regions SR1, SR2, SR2, and DR2 may include impurities of the same conductivity type. According to an embodiment, the second doped regions SR2 and DR2 may have a lower impurity concentration than that of the first doped regions SR1 and DR1. According to an embodiment, the second doped regions SR2 and DR2 may be undoped regions that are not doped with impurities. According to an embodiment, the first doped regions SR1 and DR1 may include impurities of a first conductivity type, and the second doped regions SR2 and DR2 may include impurities of a second conductivity type different from the first conductivity type. According to an embodiment, the first doped regions SR1 and DR1 may include n-type impurities, and the second doped regions SR2 and DR2 may include p-type impurities.

According to the embodiments illustrated in FIGS. 5 and 6, when the transistor is operated, carriers may flow from the first doped region SR1 of the first impurity region SR to the first doped region DR1 of the second impurity region DR through the effective channel region CH.

FIGS. 7A to 7E are plan views illustrating a method of manufacturing a semiconductor device according to embodiments. FIGS. 8A to 8E are cross-sectional views taken along lines I-I', II-II', and III-III' of FIGS. 7A to 7E, respectively, while illustrating a method of manufacturing a semiconductor device according to embodiments.

Figure 7A:
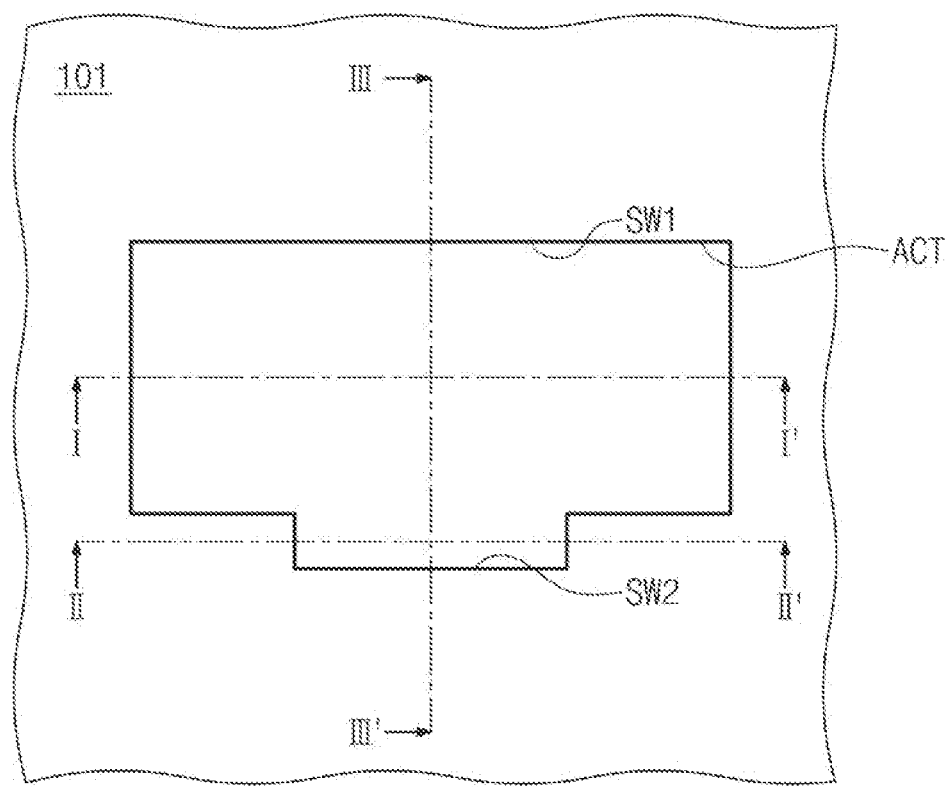
FIGS. 7A to 7E are plan views illustrating a method of manufacturing a semiconductor device according to embodiments.
Figure 8A:
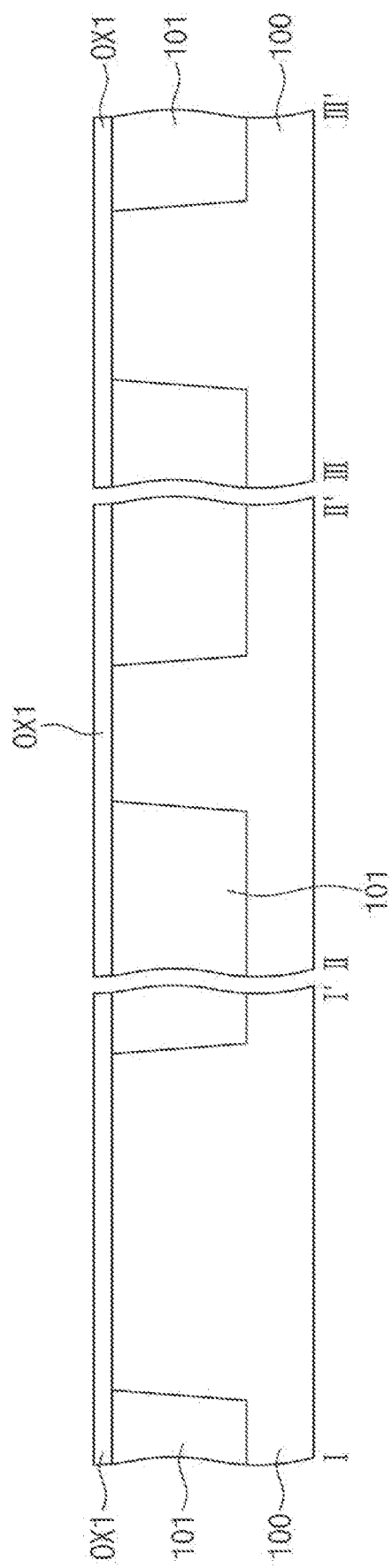
FIGS. 8A to 8E are cross-sectional views taken along lines I-I', II-II', and III-III' of FIGS. 7A to 7E, respectively, while illustrating a method of manufacturing a semiconductor device according to embodiments.

Referring to FIGS. 7A and 8A, the device isolation layer 101 defining the active region ACT may be formed in the semiconductor substrate 100.

Forming the device isolation layer 101 may include forming trenches by patterning the semiconductor substrate 100, filling an insulating material in the trenches, and performing a planarizing process on the insulating material to allow a top surface of the semiconductor substrate 100 to be exposed.

The active region ACT may have first and second sidewalls SW1 and SW2 facing each other. As described with reference to FIG. 1, the active region ACT may include the first portion having the first width and the second portion having the second width greater than the first width. Alternatively, the active region ACT may have a uniform width in the first direction D1.

After the device isolation layer 101 is formed, a first gate insulating layer OX1 having a first thickness may be formed on the semiconductor substrate 100.

The first gate insulating layer OX1 may be formed by performing a thermal oxidation process, an atomic layer deposition process, or a chemical vapor deposition process. The first gate insulating layer OX1 may include a silicon oxide layer, a silicon nitride layer, a silicon oxynitride layer, and a high-k dielectric layer.

Figure 7B:
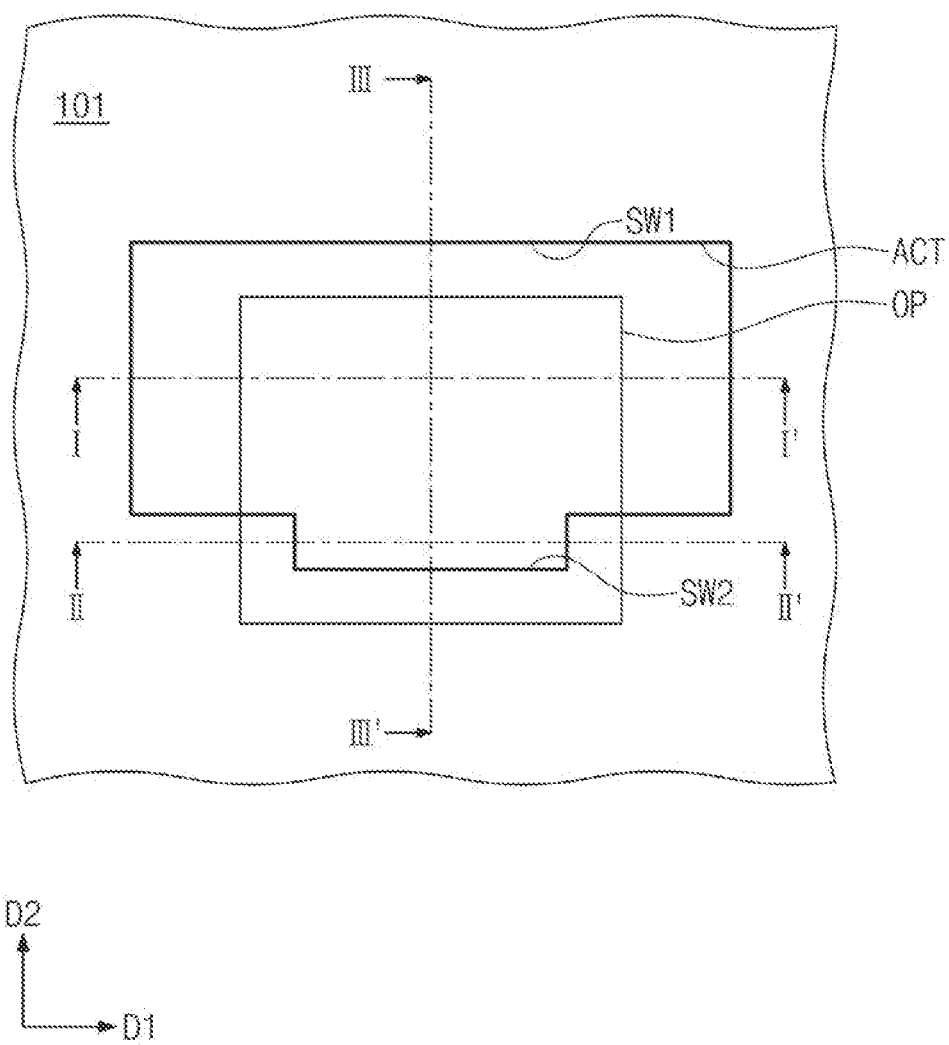
Figure 8B:
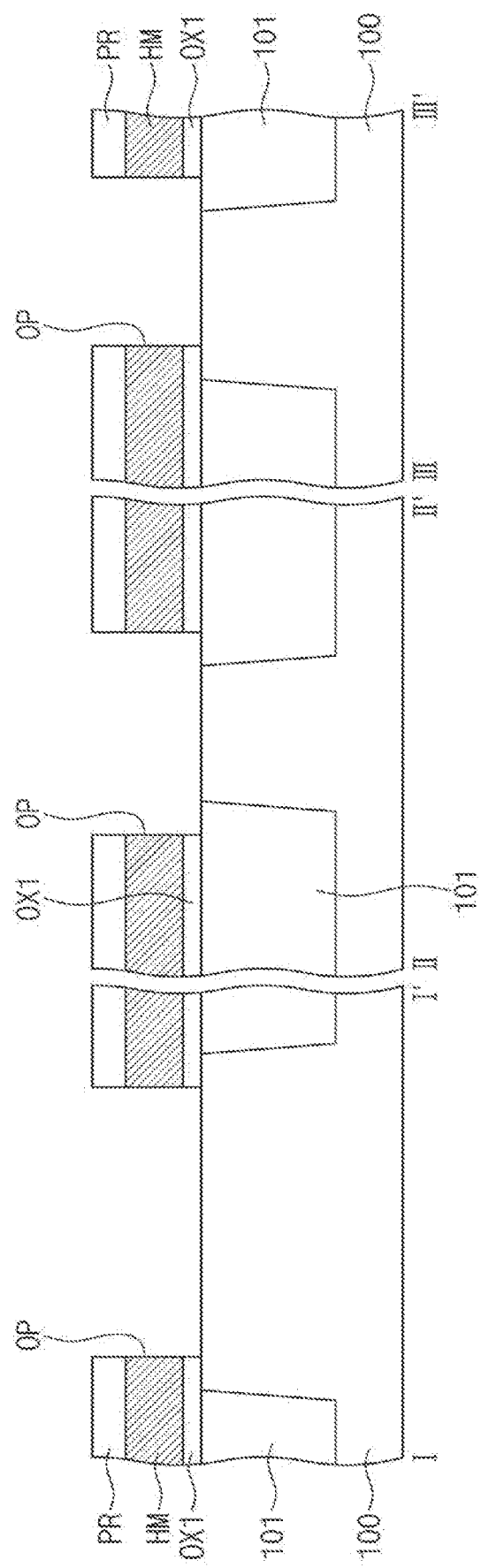

Referring to FIGS. 7B and 8B, a hard mask pattern HM and a photoresist pattern PR may be formed on the first gate insulating layer OX1.

The photoresist pattern PR may have an opening that overlaps a part of the active region ACT. The photoresist pattern PR may cover the first sidewall SW1 of the device isolation layer 101, and may expose the second sidewall SW2 of the second portion of the device isolation layer 101.

An opening OP exposing the semiconductor substrate 100 may be formed by sequentially etching the hard mask layer and the first gate insulating layer OX1 using the photoresist pattern PR as an etching mask. As the opening OP is formed, the first gate insulating layer OX1 may partially remain on the active region ACT. That is, the first gate insulating layer OX1 may remain on the first sidewall SW1 of the device isolation layer 101.

According to embodiments, as an integration degree of the semiconductor device increases, a size of the opening OP of the photoresist pattern PR may be reduced, and accordingly, the opening OP may overlap a part of the second portion of the active region ACT.

Figure 7C:
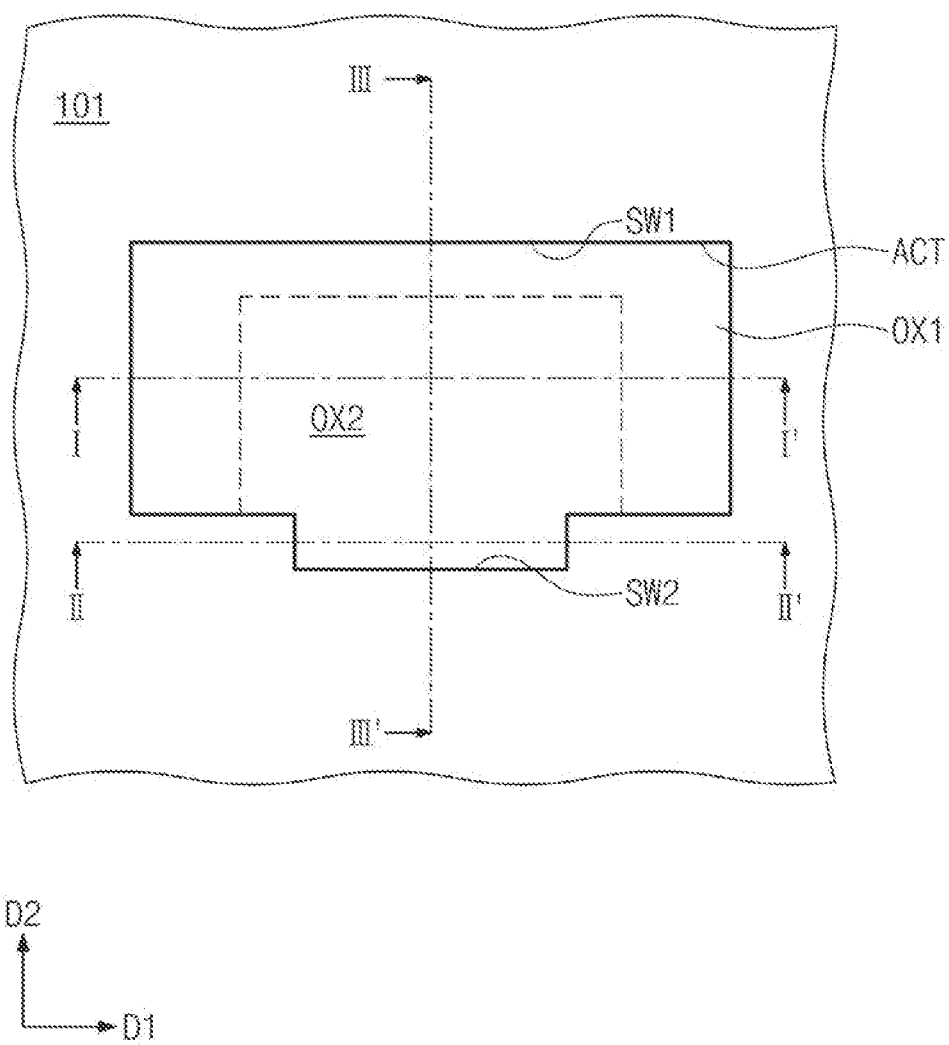
Figure 8C:
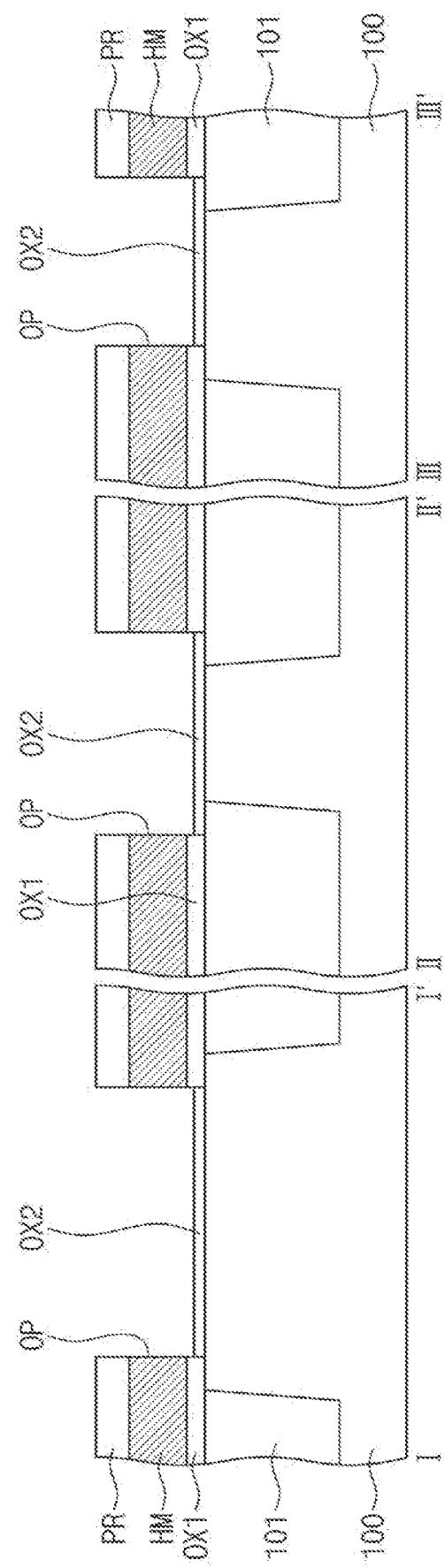

Referring to FIGS. 7C and 8C, a second gate insulating layer OX2 may be formed on the semiconductor substrate 100 exposed through the opening OP. The second gate insulating layer OX2 may have a second thickness smaller than the first thickness of the first gate insulating layer OX1. The second gate insulating layer OX2 may be formed of the same insulating material as the first gate insulating layer OX1. The second gate insulating layer OX2 may be formed by performing a thermal oxidation process, an atomic layer deposition process, or a chemical vapor deposition process.

Figure 7D:
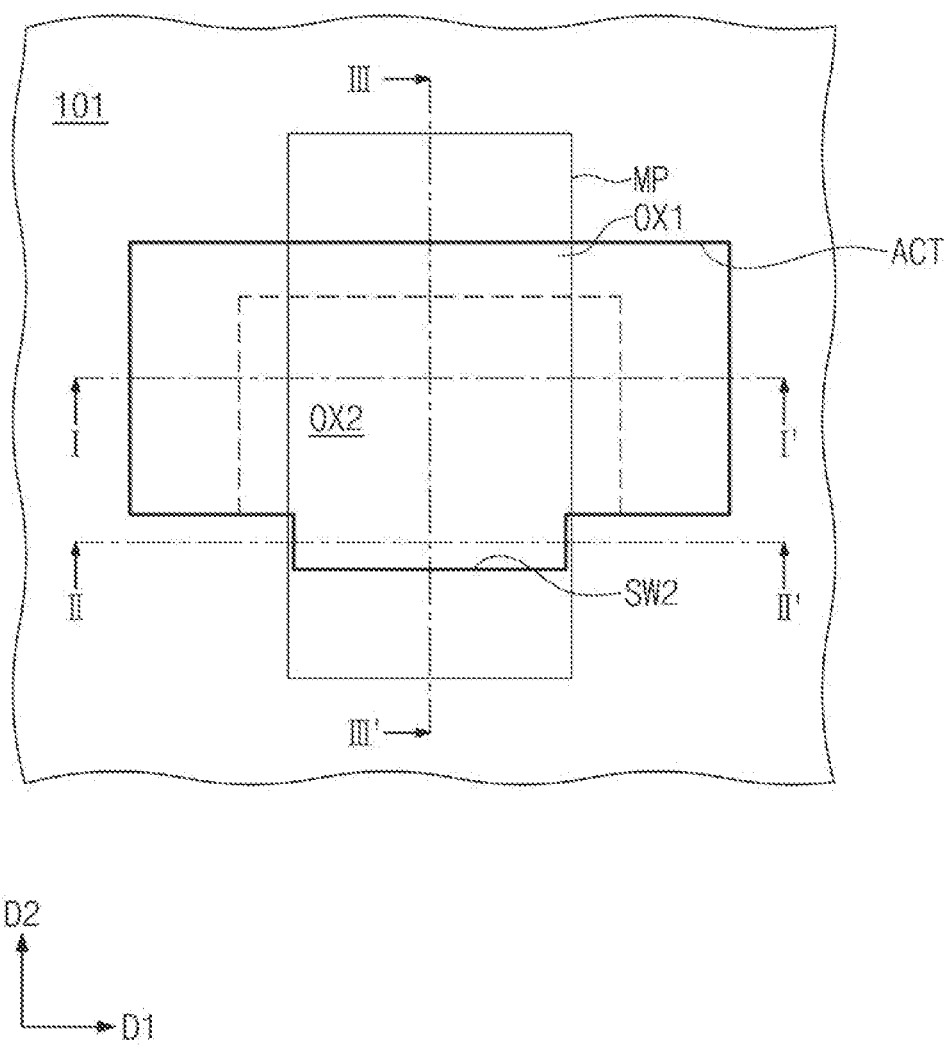
Figure 8D:
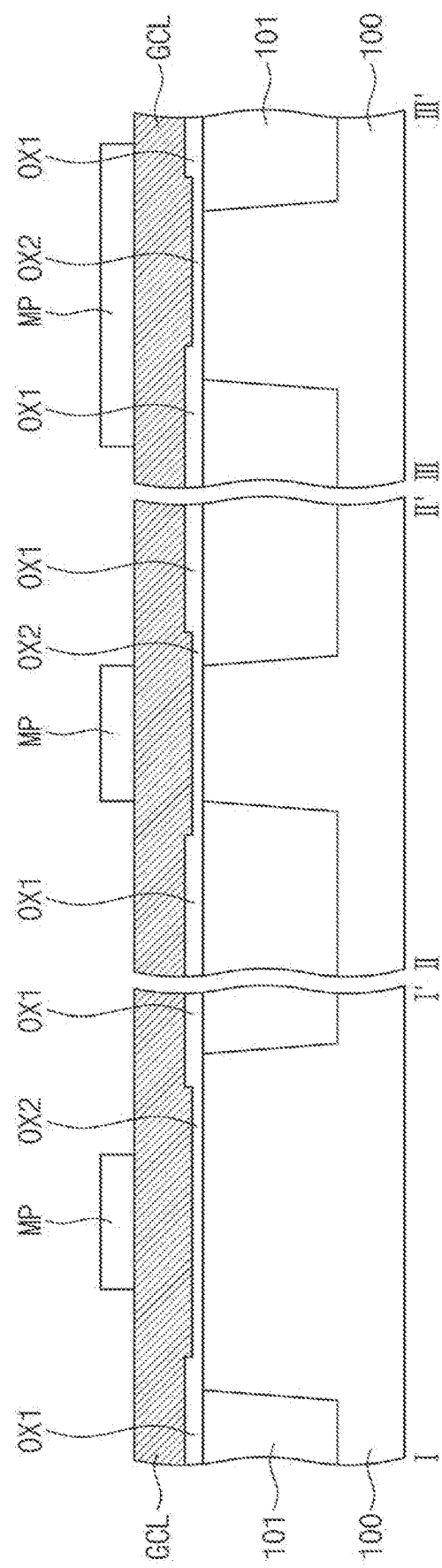

Referring to FIGS. 7D and 8D, a gate conductive layer GCL may be formed on the first and second gate insulating layers OX1 and OX2. The gate conductive layer GCL may include doped polysilicon, metal, conductive metal nitride, conductive metal silicide, conductive metal oxide, or a combination thereof.

Subsequently, a hard mask pattern MP crossing the second portion of the active region ACT may be formed on the gate conductive layer GCL. The hard mask pattern MP may include a silicon nitride layer or a silicon oxynitride layer.

Figure 7E:
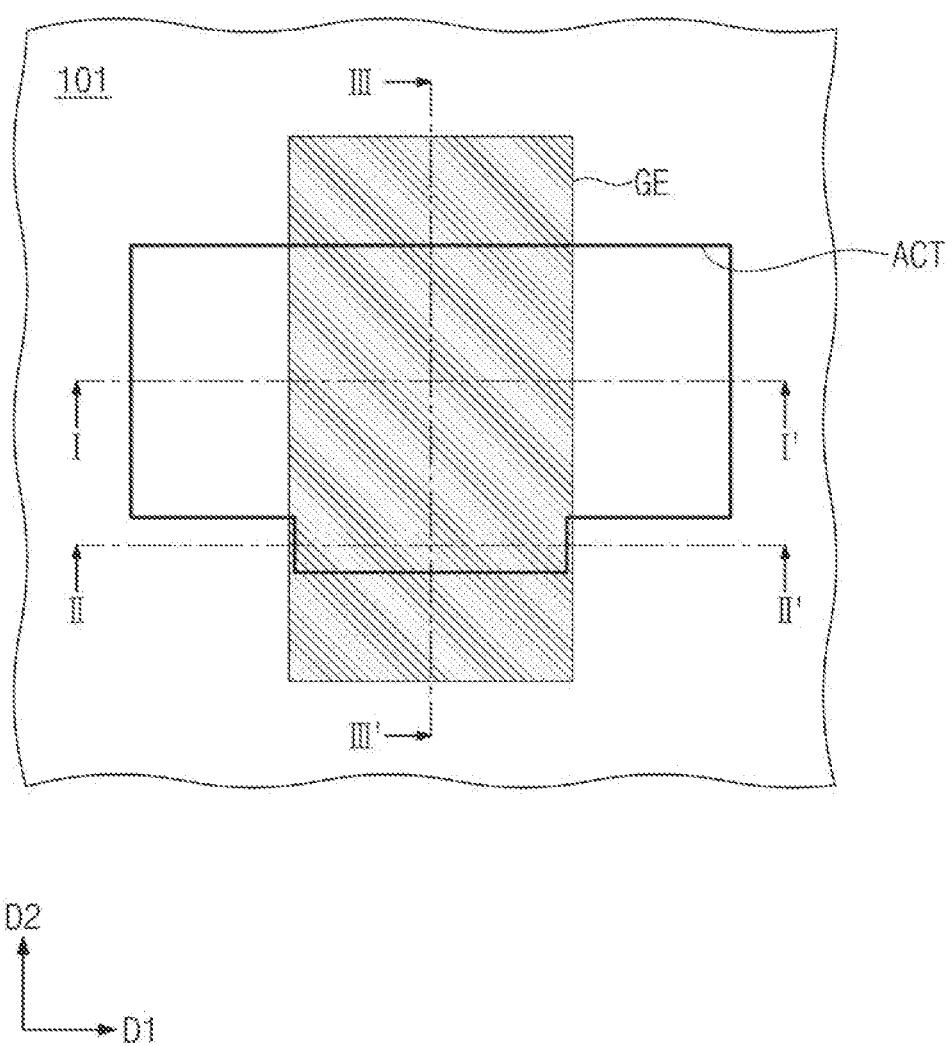
Figure 8E:
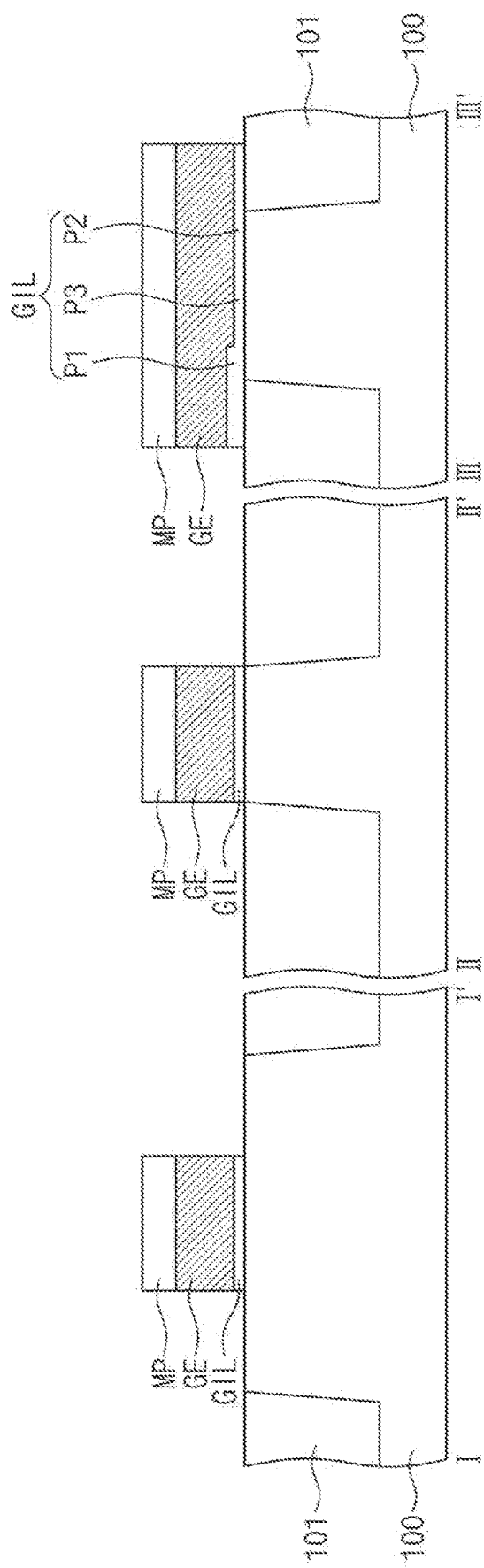

Referring to FIGS. 7E and 8E, the gate conductive layer GCL and the first and second gate insulating layers OX1 and OX2 may be anisotropically etched using the hard mask pattern MP as an etching mask, and thus the gate electrode GE and the gate insulating pattern GIL may be formed. When the gate electrode GE is formed, the first and second gate insulating layers OX1 and OX2 on both sides of the gate electrode GE may be etched to expose the semiconductor substrate 100.

The gate insulating pattern GIL formed as described above may include the first edge portion P1 having a first thickness, the second edge portion P2 having a second thickness less than the first thickness, and a center portion P3.

After forming the gate electrode GE and the gate insulating pattern GIL, as shown in FIGS. 1 and 2, the first and second impurity regions SR and DR on the both sides of the gate electrode GE may be formed.

Hereinafter, an image sensor including a semiconductor device according to embodiments will be described in detail with reference to the drawings.

Figure 9:
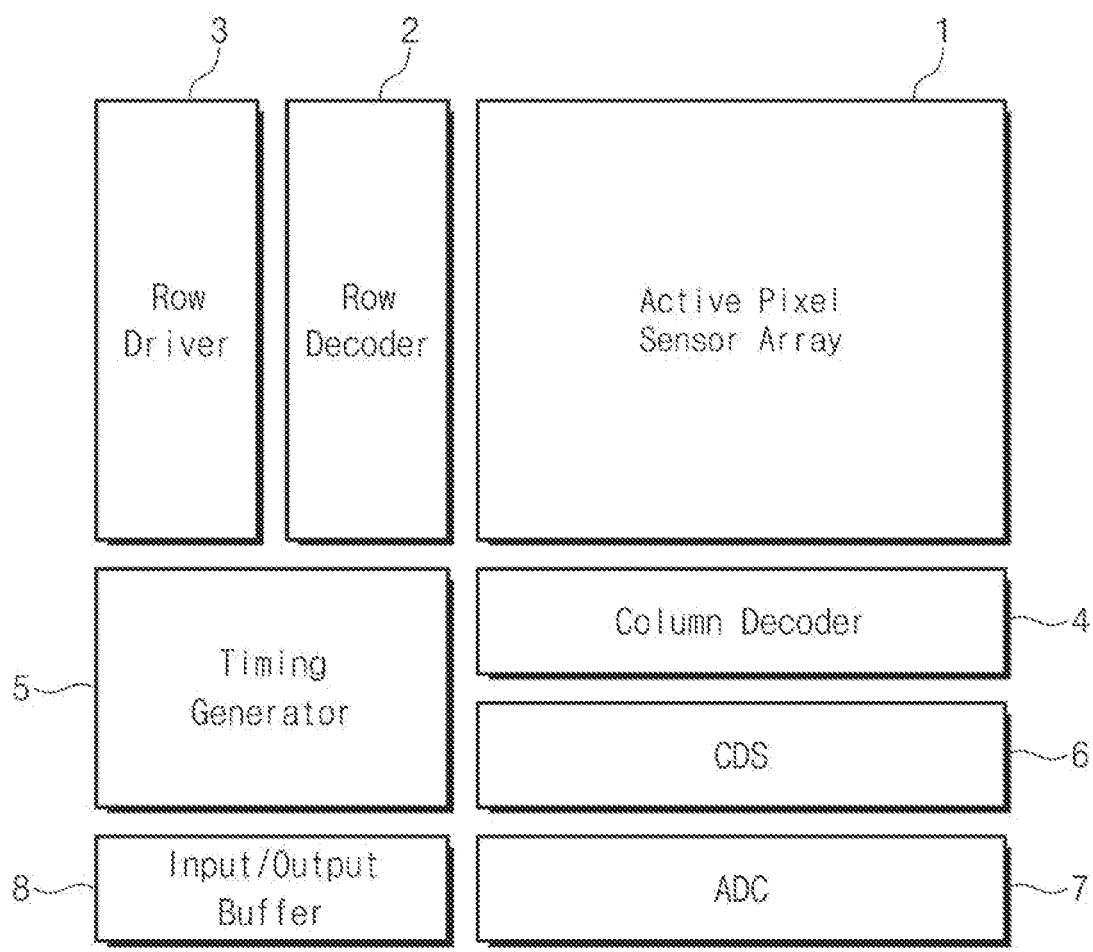
FIG. 9 is a block diagram of an image sensor according to embodiments.

FIG. 9 is a block diagram of an image sensor according to embodiments.

Referring to FIG. 9, an image sensor includes an active pixel sensor array 1, a row decoder 2, a row driver 3, a column decoder 4, a timing generator 5, a correlated double sampler (CDS) 6, an analog to digital converter (ADC) 7, and an I/O buffer 8.

The active pixel sensor array 1 may include a plurality of unit pixels arranged two-dimensionally and converts an optical signal into an electrical signal. The active pixel sensor array 1 may be driven by a plurality of driving signals such as a pixel selection signal, a reset signal, and a charge transfer signal, from a row driver. In addition, the converted electrical signal may be provided to the correlated double sampler 6.

The row driver 3 may provide, depending on a result decoded by the row decoder 2, a plurality of driving signals for driving a plurality of unit pixels to the active pixel sensor array 1. When the unit pixels are arranged in a matrix form, driving signals may be provided for each row.

The timing generator 5 may provide a timing signal and a control signal to the row decoder 2 and the column decoder 4.

The correlated double sampler (CDS) 6 may receive, hold, and sample the electrical signal generated by the active pixel sensor array 1. The correlated double sampler 6 double-samples a specific noise level and a signal level due to the electrical signal, and thus outputs a difference level corresponding to a difference between the noise level and the signal level.

The analog-to-digital converter (ADC) 7 may convert an analog signal corresponding to the difference level output from the correlated double sampler 6 into a digital signal and outputs the digital signal.

The I/O buffer 8 latches the digital signal, and the latched signal sequentially outputs, depending on a result of decoding by the column decoder 4, a digital signal to an image signal processor (not shown).

Figure 10:
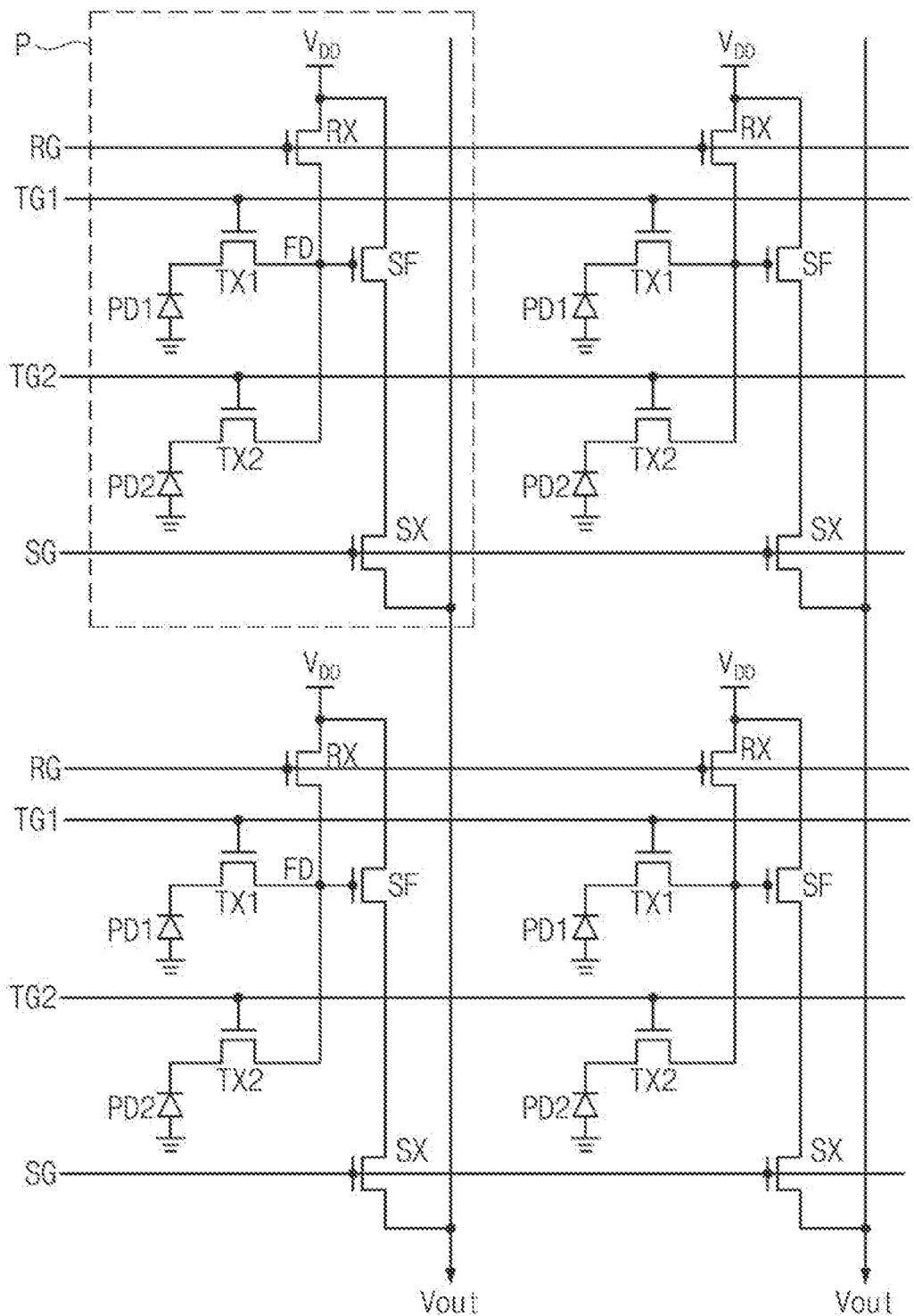
FIG. 10 is a circuit diagram of an active pixel sensor array of an image sensor according to embodiments.

FIG. 10 is a circuit diagram of an active pixel sensor array of an image sensor according to embodiments.

Referring to FIG. 10, an active pixel sensor array 1 may include a plurality of unit pixels P, and the unit pixels P may be arranged in a matrix form in a row direction and a column direction. The unit pixel P may include first and second photoelectric conversion elements PD1 and PD2, transfer transistors TX1 and TX2, and logic transistors RX, SX, and SF. Here, the logic transistors may include a reset transistor RX, a selection transistor SX, and a source follower transistor SF. Gate electrodes of the first and second transfer transistors TX1 and TX2, the reset transistor RX, and the selection transistor SX may be connected to driving signal lines TG1, TG2, RG, and SG, respectively.

The first transfer transistor TX1 may include the first transfer gate electrode TG1 and the first photoelectric conversion element PD1, and the second transfer transistor TX2 may include the second transfer gate electrode TG2 and the second photoelectric conversion element PD2. In addition, the first and second transfer transistors TX1 and TX2 may share a charge detection node FD (i.e., a floating diffusion region).

The first and second photoelectric conversion elements PD1 and PD2 may generate and accumulate photocharges in proportion to an amount of light incident from the outside. The first and second photoelectric conversion elements PD1 and PD2 may be used with a photo diode, a photo transistor, a photo gate, a pinned photo diode (PPD), and a combination thereof.

The first and second transfer gate electrodes TG1 and TG2 may transfer charges accumulated in the first and second photoelectric conversion elements PD1 and PD2 to the charge detection node FD (i.e., the floating diffusion region). The first and second transfer gate electrodes TG1 and TG2 may receive signals complementary to each other. That is, charges may be transferred from one of the first and second photoelectric conversion elements PD1 and PD2 to the charge detection node FD.

The charge detection node FD may receive and accumulatively store the charges generated by the first and second photoelectric conversion elements PD1 and PD2. The source follower transistor SF may be controlled depending on the amount of photocharges accumulated in the charge detection node FD.

The reset transistor RX may periodically reset the charges accumulated in the charge detection node FD. In detail, a drain electrode of the reset transistor RX is connected to the charge detection node FD, and a source electrode of the reset transistor RX is connected to a power supply voltage VDD. When the reset transistor RX is turned on, the power supply voltage VDD connected to the source electrode of the reset transistor RX is transferred to the charge detection node FD. Accordingly, when the reset transistor RX is turned on, the charges accumulated in the charge detection node FD may be discharged, and thus the charge detection node FD may be reset.

The source follower transistor SF may amplify a potential change in the charge detection node FD and may output the amplified or pixel signal to an output line Vout through the selection transistor SX. The source follower transistor SF may be a source follower buffer amplifier that generates a source-drain current in proportion to an amount of photoelectric charge input to the gate electrode. A gate electrode of the source follower transistor SF may be connected to the charge detection node FD, a drain of the source follower transistor SF may be connected to the power supply voltage VDD, and a source of the source follower transistor SF may be connected to a drain of the selection transistor SX.

The selection transistor SX may select the unit pixels P to be read by row. When the selection transistor SX is turned on, the power supply voltage VDD connected to the drain electrode of the source follower transistor SF may be transferred to the drain electrode of the selection transistor SX.

In FIG. 10, each of the unit pixels P is described as including the two photoelectric conversion elements PD1 and PD2, but the present inventive concepts are not limited thereto, and each unit pixel may have four photoelectric conversions elements.

Figure 11:
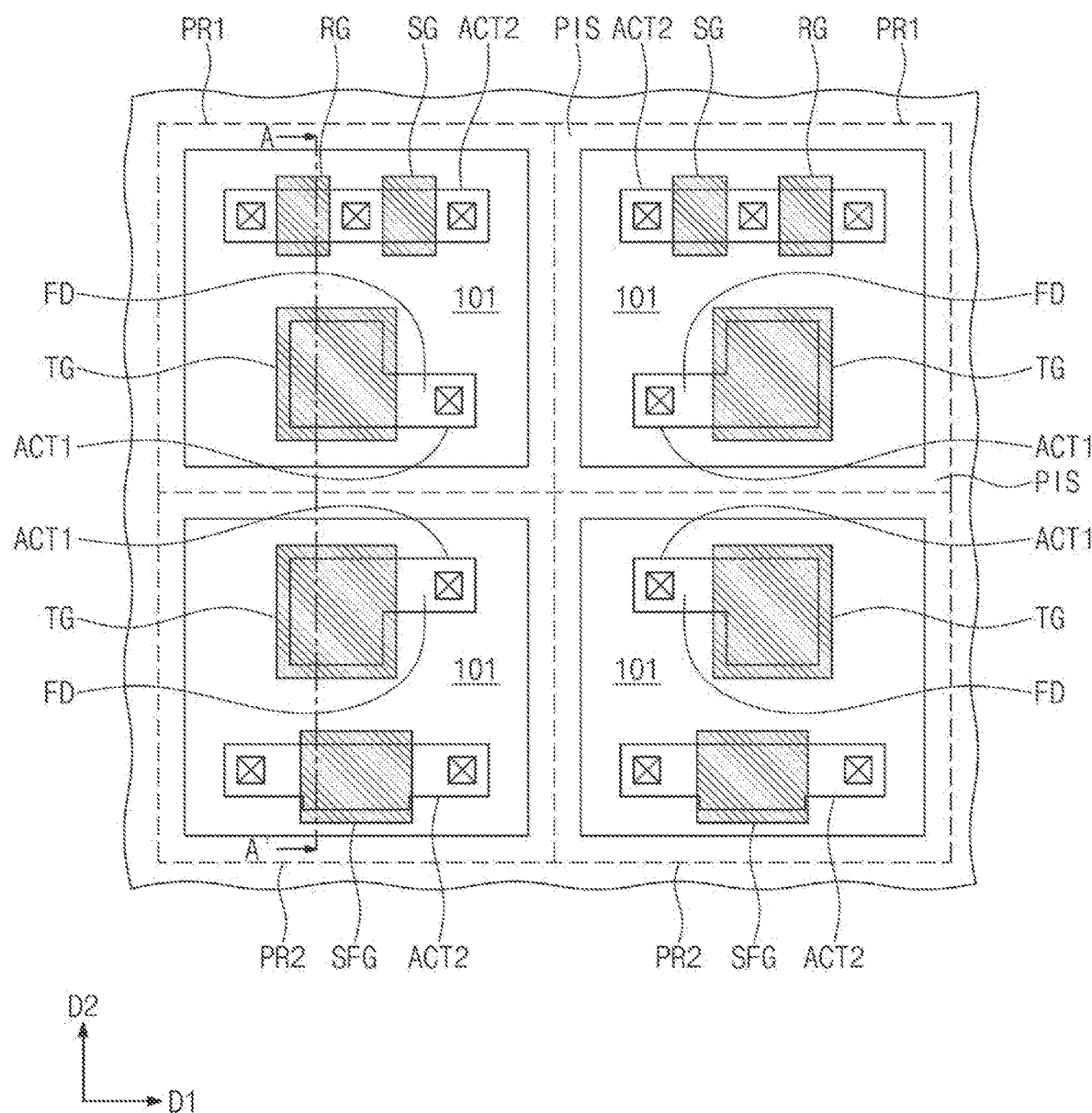
FIG. 11 is a schematic plan view of an image sensor including a semiconductor device according to embodiments.
Figure 12:
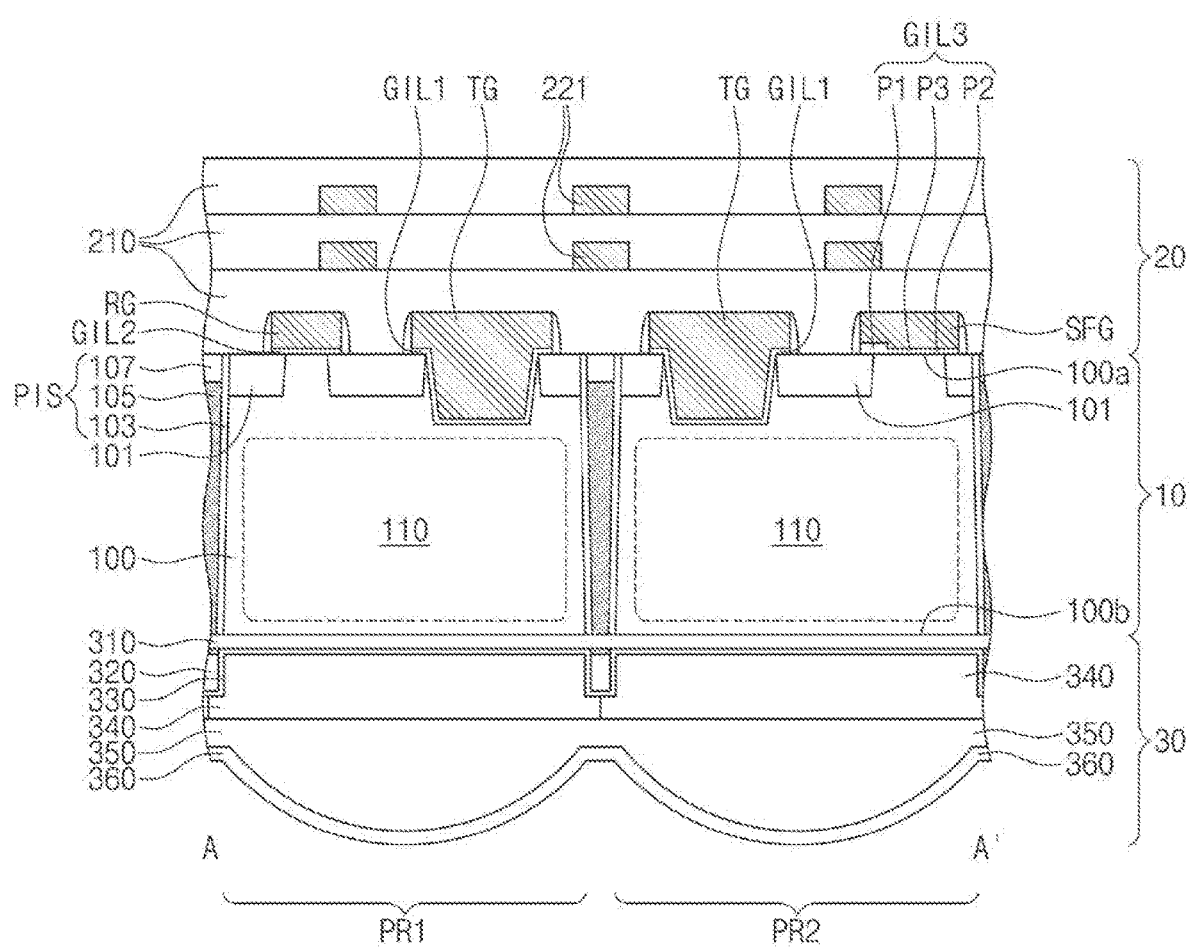
FIG. 12 is a cross-sectional view taken along line A-A' of FIG. 11.

FIG. 11 is a schematic plan view of an image sensor including a semiconductor device according to embodiments. FIG. 12 is a cross-sectional view taken along line A-A' of FIG. 11.

Referring to FIGS. 11 and 12, an image sensor according to embodiments may include a photoelectric conversion layer 10, a readout circuit layer 20, and a light transmission layer 30. The photoelectric conversion layer 10 may be disposed between the readout circuit layer 20 and the light transmission layer 30 in a vertical view.

The photoelectric conversion layer 10 may include the semiconductor substrate 100, a pixel isolation structure PIS defining first and second pixel regions PR1 and PR2, and photoelectric conversion regions 110 provided in the first and second pixel regions PR1 and PR2 may be included. Light incident from the outside may be converted into an electrical signal in the photoelectric conversion regions 110.

The readout circuit layer 20 may be disposed on a first surface 100a of the semiconductor substrate 100. The readout circuit layer 20 may include readout circuits (e.g., MOS transistors) connected to the photoelectric conversion layer 10. The electrical signal converted by the photoelectric conversion layer 10 may be signal-processed by the readout circuit layer 20.

The light transmission layer 30 may be disposed on a second surface 100b of the semiconductor substrate 100. The light transmission layer 30 may include a planarized insulating layer 310, a grid structure 320, a protective layer 330, color filters 340, micro lenses 350, and a passivation layer 360.

In detail, the semiconductor substrate 100 may have the first surface 100a (or a front surface) and the second surface 100b (or a rear surface) opposite to each other. The semiconductor substrate 100 may be an epitaxial layer formed on a bulk silicon substrate having the same first conductivity type (e.g., p-type) as that of the epitaxial layer, or a p-type epitaxial layer from which a bulk silicon substrate is removed in a fabrication process of the image sensor. Alternatively, the semiconductor substrate 100 may be a bulk semiconductor substrate 100 including a well of a first conductivity type.

The semiconductor substrate 100 may have the pixel isolation structure PIS extending from the first surface 100a to the second surface 100b. The pixel isolation structure PIS may define the first and second pixel regions PR1 and PR2. Here, the pixel isolation structure PIS may include first portions extending parallel to each other in the first direction D1 and second portions extending parallel to each other in the second direction D2 across the first portions. The pixel isolation structure PIS may surround each of the first and second pixel regions PR1 and PR2 in a plan view. A plurality of first pixel regions PR1 may be arranged in the first direction D1, and a plurality of second pixel regions PR2 may be arranged in the first direction D1. In addition, the first and second pixel regions PR1 and PR2 may be alternately arranged in the second direction D2.

The pixel isolation structure PIS may have an upper width on the first surface 100a of the semiconductor substrate 100 and a lower width on a bottom surface thereof. The lower width may be less than or substantially equal to the upper width. The width of the pixel isolation structure PIS may gradually decrease from the first surface 100a to the second surface 100b of the semiconductor substrate 100.

The pixel isolation structure PIS may include a liner insulating pattern 103, a semiconductor pattern 105, and a capping pattern 107. The semiconductor pattern 105 may vertically penetrate a part of the semiconductor substrate 100, and the liner insulating pattern 103 may be provided between the semiconductor pattern 105 and the semiconductor substrate 100. The capping pattern 107 may be disposed on the semiconductor pattern 105, and may have an upper surface at substantially the same level as an upper surface of the device isolation layer 101. The liner insulating pattern 103 and the capping pattern 107 may include at least one of a silicon oxide layer, a silicon oxynitride layer, and a silicon nitride layer. The semiconductor pattern 105 may include an undoped polysilicon layer or a polysilicon layer doped with impurities. Further, the semiconductor pattern 105 may include an air gap or void.

The photoelectric conversion regions 110 may be provided in the semiconductor substrate 100 of each of the first and second pixel regions PR1 and PR2. The photoelectric conversion regions 110 may generate photocharges in proportion to an intensity of incident light. The photoelectric conversion regions 110 may be formed by implanting impurities having a second conductivity type opposite to that of the semiconductor substrate 100 into the semiconductor substrate 100. Photodiodes may be formed by a junction between the semiconductor substrate 100 of the first conductivity type and the photoelectric conversion region 110 of the second conductivity type.

The device isolation layer 101 may define first and second active regions ACT1 and ACT2 on the first surface 100a of the semiconductor substrate 100 in each of the first and second pixel regions PR1 and PR2. The first and second active regions ACT1 and ACT2 may be disposed to be spaced from each other in the first and second pixel regions PR1 and PR2, and may have different sizes.

In the first pixel region PR1, the first sidewall and the second sidewall of the device isolation layer 101 facing each other in the second direction D2 may be symmetrical to each other. In the second pixel region PR2, the first sidewall and the second sidewall of the device isolation layer 101 may be asymmetrical to each other.

According to embodiments, the second active region ACT2 of the first pixel region PR1 may have a different shape from the second active region ACT2 of the second pixel region PR2. The second active region ACT2 of the first pixel region PR1 may have a long axis in the first direction D1 and may have a bar shape having a uniform width. The second active region ACT2 of the second pixel region PR2 may have substantially the same characteristics as the active region ACT described above with reference to FIGS. 1 and 2. That is, the second active region ACT2 of the second pixel region PR2 may include first portions which are spaced from each other in the first direction D1 and have a first width in the second direction D2 and a second portion which are between the first portions and has a second width in the second direction D2.

A transfer gate electrode TG may be disposed on the first active region ACT1 of each of the first and second pixel regions PR1 and PR2. Each transfer gate electrode TG may be disposed on the center portion of each of the first and second pixel regions PR1 and PR2 from a plan view. Each transfer gate electrode TG may include a lower portion inserted into the semiconductor substrate 100 and an upper portion connected to the lower portion and protruding above the first surface 100a of the semiconductor substrate 100. The lower portion of each transfer gate electrode TG may penetrate a part of the semiconductor substrate 100. A bottom surface of each transfer gate electrode TG may be positioned at a lower level than that of the first surface 100a of the semiconductor substrate 100. A first gate insulating pattern GIL1 may be interposed between each transfer gate electrode TG and the semiconductor substrate 100.

A floating diffusion region FD may be provided in the first active region ACT1 at one side of each transfer gate electrode TG. The floating diffusion region FD may be an impurity region having a conductivity type opposite to that of the semiconductor substrate 100.

According to embodiments, the reset gate electrode RG and the selection gate electrode SG may be disposed on the second active region ACT2 of the first pixel region PR1, and the source follower gate electrode SFG may be disposed on the second active region ACT2 of the second pixel region PR2.

A second gate insulating pattern GIL2 may be disposed between the reset gate electrode RG and the selection gate electrode SG, and the semiconductor substrate 100, and a third gate insulating pattern GIL3 may be disposed between the source follower gate electrode SFG and the semiconductor substrate 100.

The third gate insulating pattern GIL3 may have substantially the same characteristics as the gate insulating pattern GIL described above with reference to FIGS. 1 and 2. That is, the third gate insulating pattern GIL3 has a first edge portion having a first thickness adjacent to the first sidewall of the device isolation layer 101, a second edge portion which is adjacent to the second sidewall of the device isolation layer 101 and has a second thickness smaller than the first thickness, and a center portion between the first and second edge portions.

Source/drain impurity regions may be provided in the second active regions ACT2 on the both sides of the reset gate electrode RG, the selection gate electrode SG, and the source follower gate electrode SFG. Contact plugs may be connected to the source/drain impurity regions.

The channel region under the source follower gate electrode SFG may include first and second edges and an effective channel therebetween, as described above with reference to FIGS. 1 and 2. The first edge and the effective channel may be provided between the source/drain impurity regions.

Interlayer insulating layers 210 may be stacked on the first surface 100a of the semiconductor substrate 100, and the interlayer insulating layers 210 may cover MOS transistors constituting readout circuits and the transfer gate electrode TG. The interlayer insulating layers 210 may include, for example, silicon oxide, silicon nitride, and/or silicon oxynitride.

An interconnection structure 221 connected to the readout circuits may be disposed in the interlayer insulating layers 210. The interconnection structure 221 may include metal lines of different levels and contact plugs connecting the metal lines.

The planarized insulating layer 310 may cover the second surface 100b of the semiconductor substrate 100. The planarized insulating layer 310 may be formed of a transparent insulating material and may include a plurality of layers. The planarized insulating layer 310 may be formed of an insulating material having a different refractive index from the semiconductor substrate 100. The planarized insulating layer 310 may include metal oxide and/or silicon oxide.

The grid structure 320 may be disposed on the planarized insulating layer 310. Similar to the pixel isolation structure PIS, the grid structure 320 may have a grid shape in a plan view. The grid structure 320 may overlap the pixel isolation structure PIS in a plan view. That is, the grid structure 320 may include first portions extending in the first direction D1 and second portions extending in the second direction D2 across the first portions. A width of the grid structure 320 may be substantially the same as or less than a minimum width of the pixel isolation structure PIS.

The grid structure 320 may include a conductive pattern and/or a low refractive pattern. A light blocking pattern may include, for example, a metal material such as titanium, tantalum, or tungsten. The low refractive pattern may be formed of a material having a lower refractive index than that of the light blocking pattern. The low refractive pattern may be formed of an organic material and may have a refractive index of about 1.1 to 1.3. For example, the grid structure may be a polymer layer containing silica nanoparticles.

The protective layer 330 may cover a surface of the grid structure 320 on the planarized insulating layer 310 with a substantially uniform thickness. The protective layer 330 may include, for example, a single layer or multiple layers of at least one of an aluminum oxide layer and a silicon carbide layer.

The color filters 340 may be formed to correspond to the first and second pixel regions PR1 and PR2, respectively. The color filters 340 may fill a space defined by the grid structure 320. The color filters 340 may include red, green, or blue color filters or magenta, cyan, or yellow color filters, depending on a unit pixel.

The micro lenses 350 may be disposed on the color filters 340. The micro lenses 350 may have a convex shape and may have a certain radius of curvature. The micro lenses 350 may be formed of a light transmitting resin.

The passivation layer 360 may conformally cover the surfaces of the micro lenses 350. The passivation layer 360 may be formed of, for example, an inorganic oxide.

Figure 13:
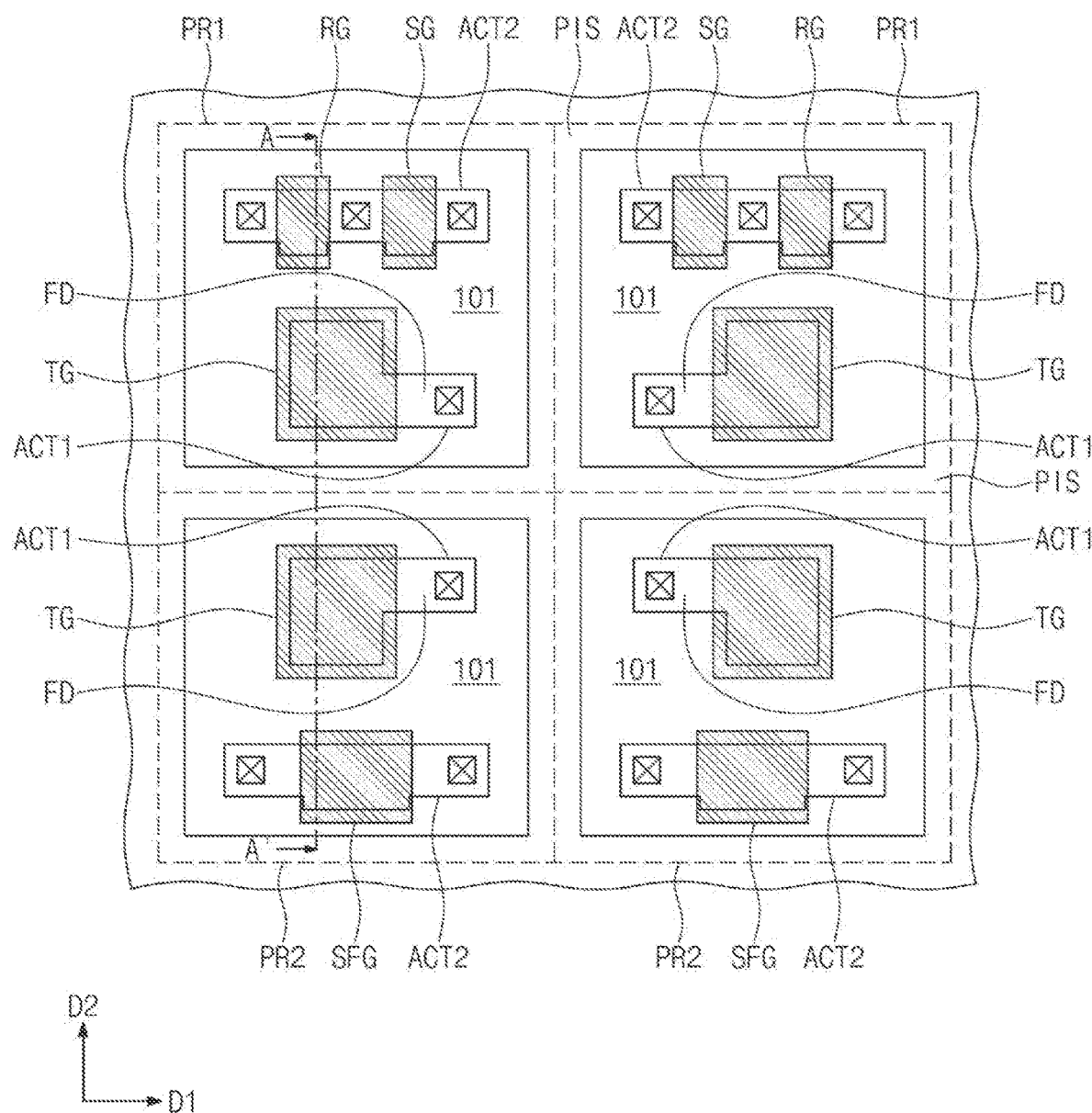
FIG. 13 is a schematic plan view of an image sensor including a semiconductor device according to embodiments.
Figure 14:
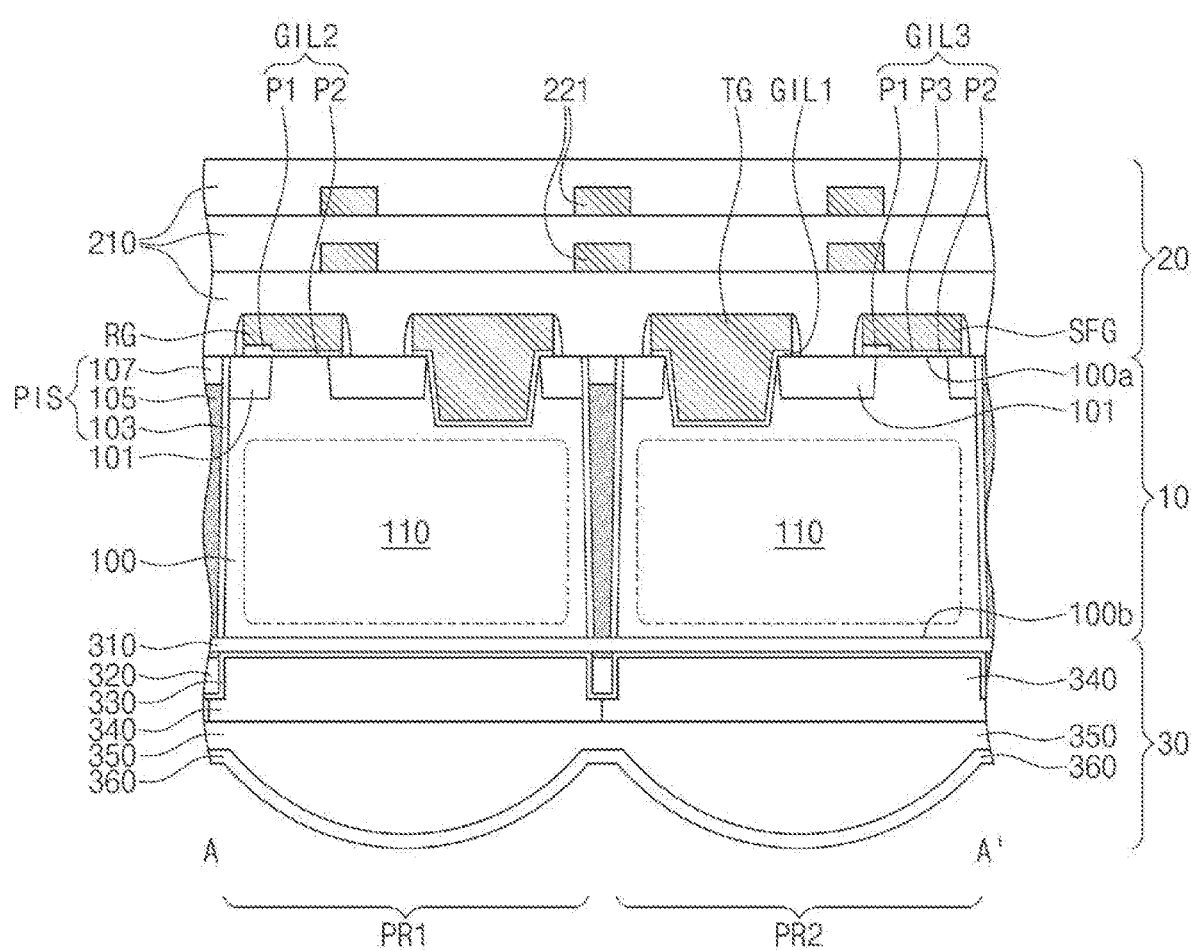
FIG. 14 is a cross-sectional view taken along line A-A' of FIG. 13.

FIG. 13 is a schematic plan view of an image sensor including a semiconductor device according to embodiments. FIG. 14 is a cross-sectional view taken along line A-A' of FIG. 13. For simplicity of description, descriptions of the same technical features as those of the image sensor previously described with reference to FIGS. 11 and 12 may be omitted.

Referring to FIGS. 13 and 14, in each of the first and second pixel regions PR1 and PR2, the device isolation layer 101 may define first and second active regions ACT1 and ACT2. In the first pixel region PR1, the first sidewall and the second sidewall of the device isolation layer 101 may be asymmetrical to each other.

In the first pixel region PR1, the second active region ACT2 may include first portions having a first width and second portions having a second width greater than the first width. Here, each of the second portions may be provided between the first portions. Unlike this, the second active region ACT2 in the first pixel region PR1 may include one second portion.

A reset gate electrode RG and a selection gate electrode SG may be disposed on the second active region ACT2 of the first pixel region PR1, and the reset gate electrode RG and the selection gate electrode SG may cross each of the second portions of the second active region ACT2.

A second gate insulating pattern GIL2 may be disposed between the reset and selection gate electrodes RG and SG and the semiconductor substrate 100, and the second gate insulating pattern GIL2, may have substantially the same characteristics as the gate insulating pattern GIL described above with reference to FIGS. 1 and 2. That is, the second gate insulating pattern GIL2 may include a first edge portion which has a first thickness and is adjacent to the first sidewall of the device isolation layer 101, a second edge portion which is adjacent to the second sidewall of the device isolation layer 101 and has a second thickness smaller than the first thickness, and a center portion between the first and second edge portions.

Figure 15:
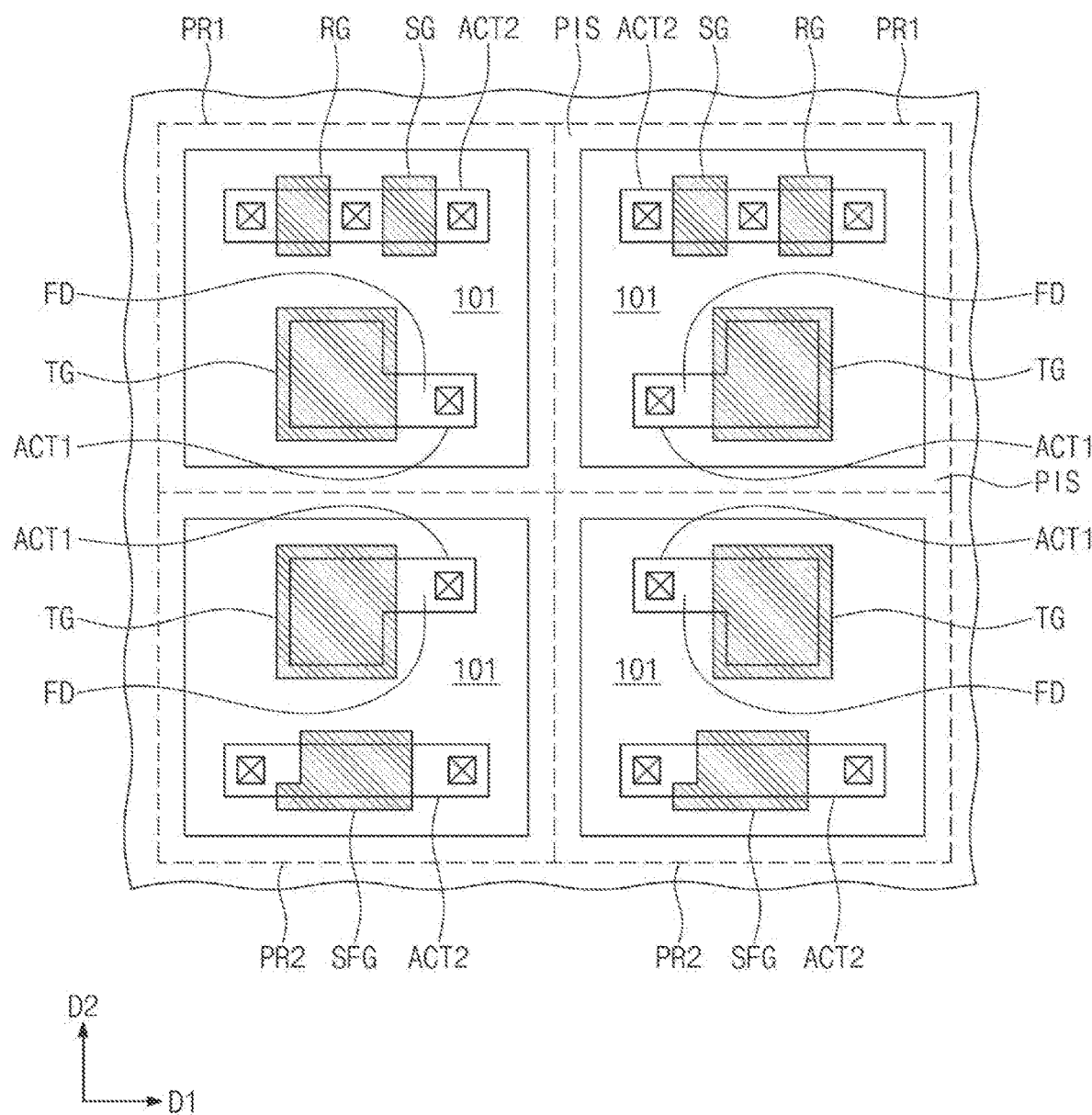
FIGS. 15 and 16 are schematic plan views of image sensors including semiconductor devices according to embodiments.
Figure 16:
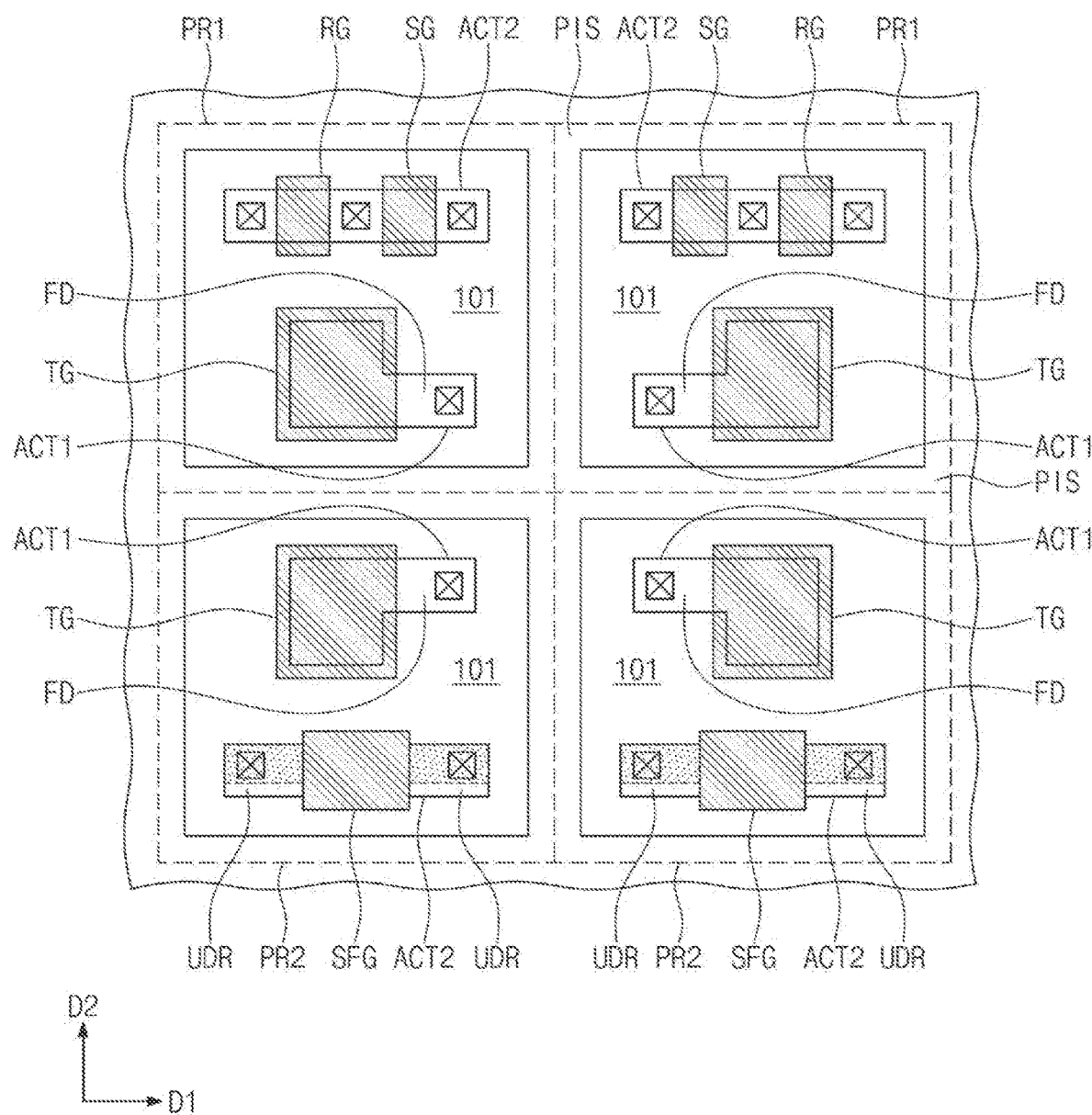

FIGS. 15 and 16 are schematic plan views of image sensors including semiconductor devices according to embodiments. For simplicity of description, descriptions of the same technical features as those of the image sensor previously described with reference to FIGS. 11 and 12 may be omitted.

Referring to FIG. 15, in each of the first and second pixel regions PR1 and PR2, the second active region ACT2 may have a long axis in the first direction D1 and may have a bar shape having a uniform width.

A source follower gate electrode SFG may be disposed on the second active region ACT2 of the second pixel region PR2, and the source follower gate electrode SFG, as described above with reference to FIGS. 3A and 4A, may include a first portion having a first gate width and a second portion having a second gate width greater than the first gate width. Here, the second portion of the source follower gate electrode SFG may protrude onto one of the source/drain impurity regions.

The source follower gate electrode SFG may include the same features as described with reference to FIGS. 3B, 3C, 4B, and 4C.

A third gate insulating pattern GIL3 may be disposed between the source follower gate electrode SFG and the semiconductor substrate 100, and the third gate insulating pattern GIL3 may include first and second edge portions having different thicknesses from each other, as described above.

Referring to FIG. 16, in each of the first and second pixel regions PR1 and PR2, the second active region ACT2 may have a lengthwise axis in the first direction D1 and may have a bar shape having a uniform width.

A source follower gate electrode SFG may be disposed on the second active region ACT2 of the second pixel region PR2, and source/drain impurity regions and undoped regions UDR may be provided on both sides of the source follower gate electrode SFG.

A source follower transistor provided in the second active region ACT2 of the second pixel region PR2 may include substantially the same features as the transistor described above with reference to FIGS. 5 and 6.

Figure 17:
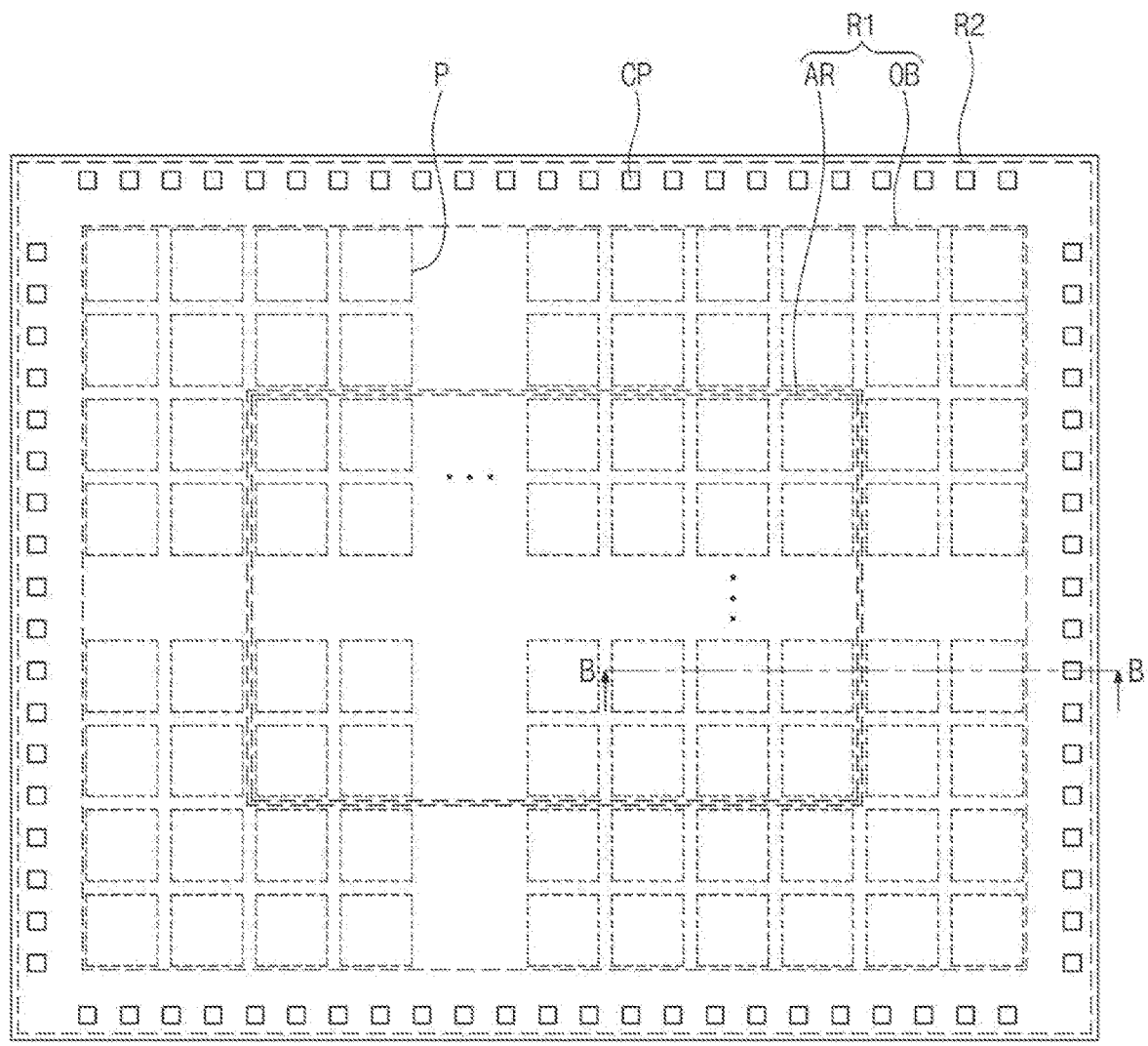
FIG. 17 is a schematic plan view of an image sensor including a semiconductor device according to embodiments.
Figure 18:
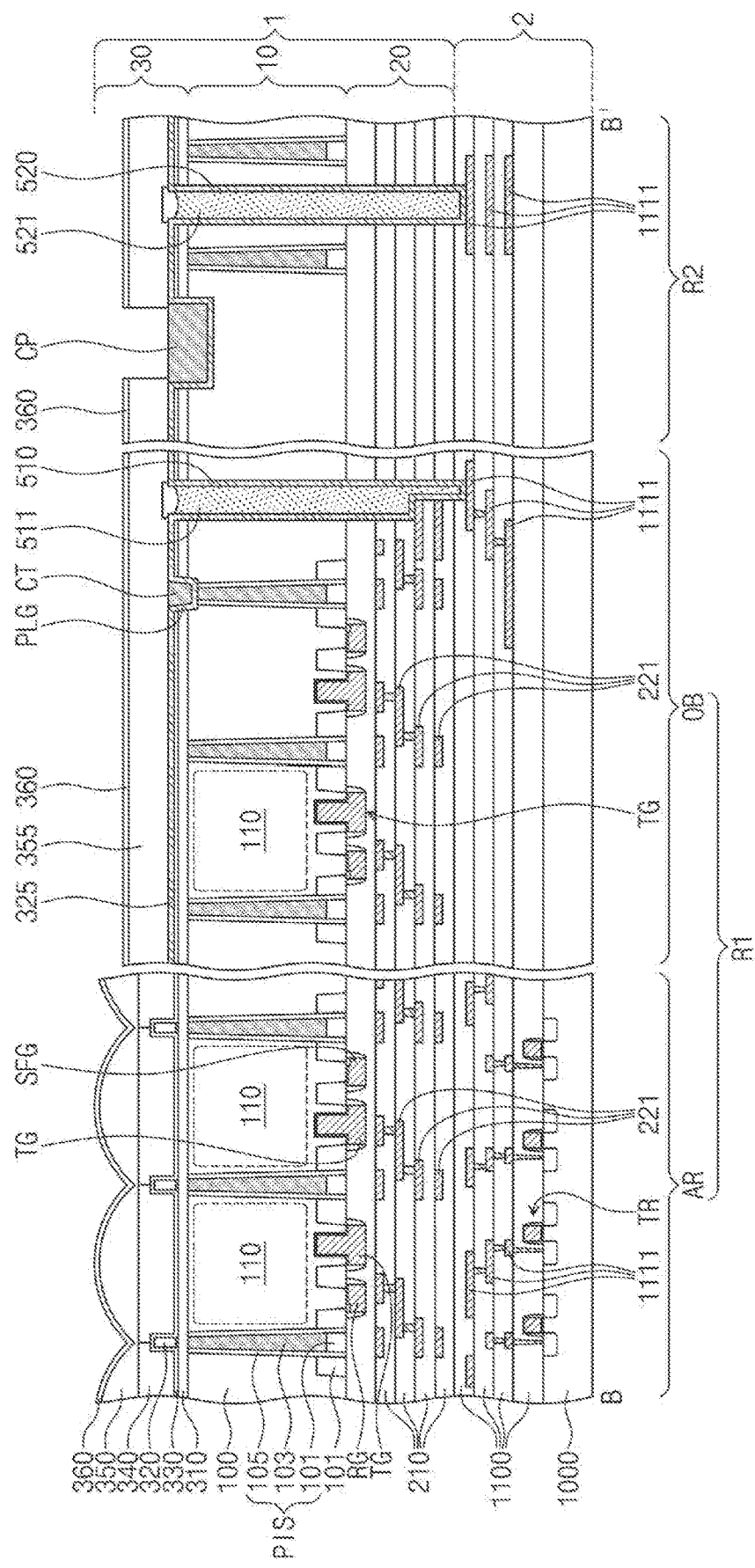
FIG. 18 illustrates a cross-sectional view taken along line B-B' of FIG. 17.

FIG. 17 is a schematic plan view of an image sensor including a semiconductor device according to embodiments. FIG. 18 illustrates a cross-sectional view taken along line B-B' of FIG. 17.

Referring to FIGS. 17 and 18, an image sensor may include a sensor chip 1 and a logic chip 2. The sensor chip 1 may include a pixel array region R1 and a pad region R2.

The pixel array region R1 may include a plurality of unit pixels P arranged two-dimensionally in a first direction D1 and a second direction D2 intersecting each other. Each of the unit pixels P may include a photoelectric conversion element and a read element. Electrical signals generated by incident light from each of the unit pixels P of the pixel array region R1 may be output.

The pixel array region R1 may include a light receiving portion AR and a light blocking portion OB. The light blocking portion OB may surround the light receiving portion AR in a plan view. That is, the light blocking portion OB may be disposed above and below and left and right sides of the light receiving portion AR in a plan view. Reference pixels to which light is not incident may be provided in the light blocking portion OB, and an amount of charge sensed by the unit pixels of the light receiving portion AR is compared based on an amount of reference charge generated in the reference pixels, thereby calculating a magnitude of the electrical signal sensed by the unit pixel.

A plurality of conductive pads CP used to input/output control signals, photoelectric signals, and the like may be disposed in the pad region R2. The pad region R2 may surround the pixel array region R1, in a plan view, to facilitate electrical connection with external elements. The conductive pads CP may input/output electrical signals generated from the unit pixels P to an external device.

As described above, the sensor chip 1 may include the photoelectric conversion layer 10 between the readout circuit layer 20 and the light transmission layer 30, in a vertical direction.

As described above, the photoelectric conversion layer 10 of the sensor chip 1 may include the semiconductor substrate 100, the pixel isolation structure PIS defining pixel regions PR, and photoelectric conversion regions 110 provided in the pixel regions PR.

In the light receiving portion AR, the sensor chip 1 may include the same technical features as the image sensor described above.

In the light blocking portion OB, a part of the pixel isolation structure PIS may be connected to a contact pad CT. The contact pad CT may be provided on the second surface 100b of the semiconductor substrate 100 in the light blocking portion OB. The contact pad CT may include aluminum.

The planarized insulating layer 310 may extend from the light receiving portion AR to the light blocking portion OB and the pad region R2. In the light blocking portion OB, a light blocking pattern 325 may be disposed on the planarized insulating layer 310. The light blocking pattern 325 may block light from entering the photoelectric conversion regions 110 provided in the light blocking portion OB.

In the light blocking portion OB, a first through conductive pattern 510 may penetrate the semiconductor substrate 100 to be electrically connected to a metal wiring 221 of the readout circuit layer 20 and a wiring structure 1111 of the logic chip 2. The first through conductive pattern 510 may have a first bottom surface and a second bottom surface positioned at different levels. A first buried pattern 511 may be provided inside the first through conductive pattern 510. The first buried pattern 511 may include a low refractive material and may have insulating properties.

In the pad region R2, the conductive pads CP may be provided on the second surface 100b of the semiconductor substrate 100. The conductive pads CP may include a metal such as aluminum, copper, tungsten, titanium, tantalum, or an alloy thereof. In a mounting process of the image sensor, a bonding wire may be bonded to the conductive pads CP. The conductive pads CP may be electrically connected to an external device through the bonding wire.

In the pad region R2, a pixel isolation structure PIS may be provided around the conductive pads CP.

In the pad region R2, a second through conductive pattern 520 may pass through the semiconductor substrate 100 to be electrically connected to the wiring structure 1111 of the logic chip 2. The second through conductive pattern 520 may extend on the second surface 100b of the semiconductor substrate 100 to be electrically connected to the conductive pads CP. A part of the second through conductive pattern 520 may cover bottom surfaces and sidewalls of the conductive pads CP. A second buried pattern 521 may be provided inside the second through conductive pattern 520. The second buried pattern 521 may include a low refractive material and may have insulating properties.

An organic layer 355 may be disposed on the light blocking portion OB and the pad region R2. The organic layer 355 may cover the light blocking pattern 325, the contact pad CT, and the conductive pads CP.

The logic chip 2 may include a logic semiconductor substrate 1000, logic circuits TR, the wiring structures 1111 connected to the logic circuits, and logic interlayer insulating layers 1100. The uppermost layer of the logic interlayer insulating layers 1100 may be bonded to the readout circuit layer 20 of the sensor chip 1. The logic chip 2 may be electrically connected to the sensor chip 1 through the first through conductive pattern 510 and the second through conductive pattern 520.

In an example, it has been described that the sensor chip 1 and the logic chip 2 are electrically connected to each other through the first and second through conductive patterns, but the present inventive concepts are not limited thereto. As another example, bonding pads provided on the uppermost metal layer of the sensor chip and the logic chip may be bonded to each other, and thus the sensor chip and the logic chip may be electrically connected.

Hereinafter, a semiconductor memory device including a semiconductor device according to embodiments will be described in detail with reference to the drawings.

Figure 19:
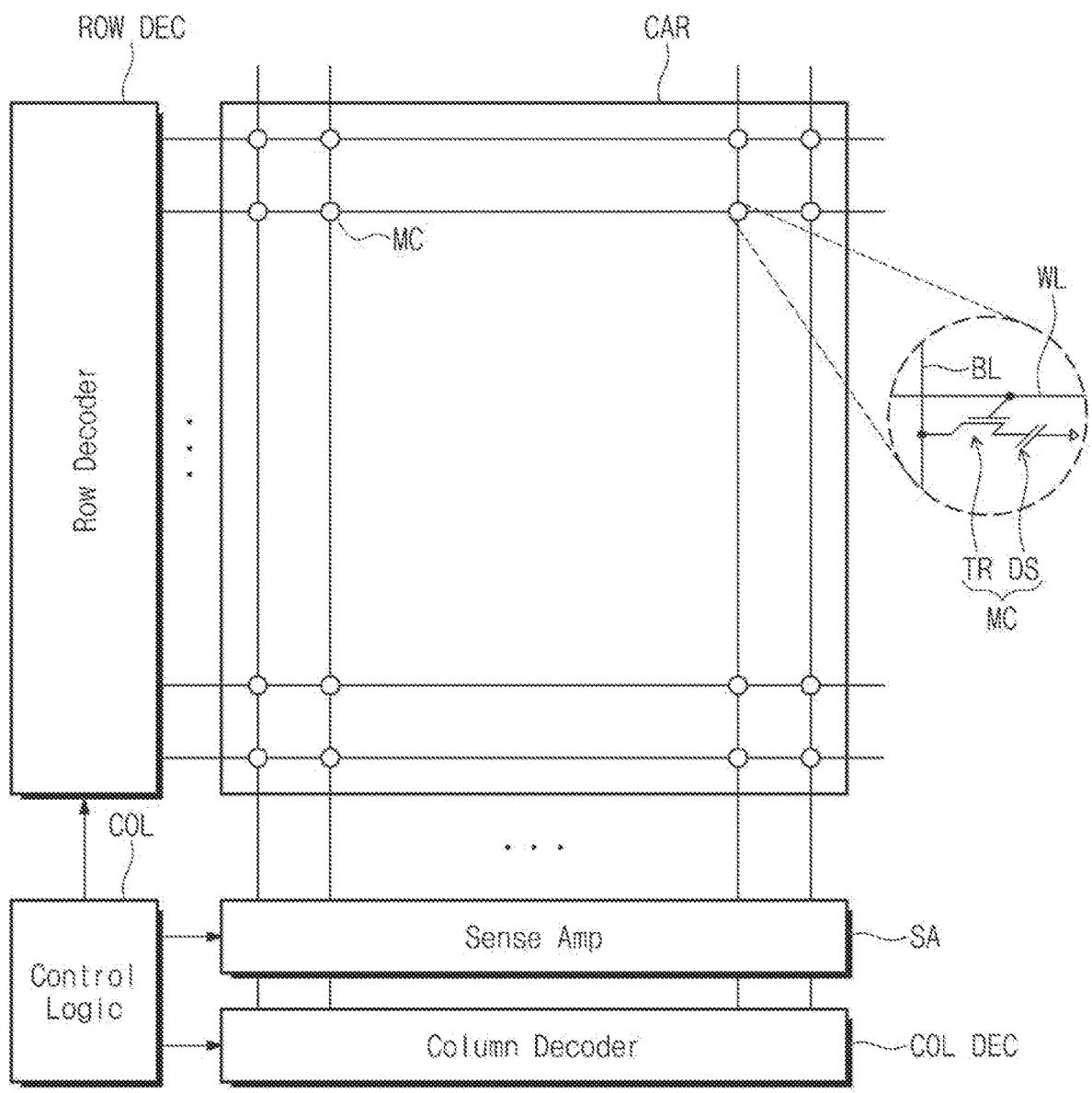
FIG. 19 is a block diagram of a semiconductor memory device including a semiconductor device according to embodiments.

FIG. 19 is a block diagram of a semiconductor memory device including a semiconductor device according to embodiments.

Referring to FIG. 19, a semiconductor memory device may include a memory cell array CAR, a row decoder ROW DEC, a sense amplifier SA, a column decoder COL DEC, and a control logic COL.

The memory cell array CAR may include a plurality of memory cells MC that are arranged two-dimensionally or three-dimensionally. Each of the memory cells MC may be connected between a word line WL and a bit line BL crossing each other.

Each of the memory cells MC includes a selection element TR and a data storage element DS, and the selection element TR and the data storage element DS may be electrically connected in series. The data storage element DS may be connected between the bit line BL and the selection element TR, and the selection element TR may be connected between the data storage element DS and the word line WL. The selection element TR may be a field effect transistor (FET), and the data storage element DS may be implemented as a capacitor, a magnetic tunnel junction pattern, a variable resistor, or the like. As an example, the selection element TR may include a transistor, a gate electrode of the transistor is connected to the word line WL, and drain/source terminals of the transistor may be connected to the bit line BL and the data storage element DS, respectively.

The row decoder ROW DEC may decode an externally inputted address and may select any one of the word lines WL of the memory cell array CAR. The address decoded by the row decoder ROW DEC may be provided to a row driver (not shown), and the row driver may provide a certain voltage to the selected word line WL and the unselected word lines WL in respond to a control of control circuits, respectively.

The sense amplifier SA may sense, amplify, and output a voltage difference between a selected bit line BL and a reference bit line depending on the decoded address from the column decoder COL DEC.

The column decoder COL DEC may provide a data transmission path between the sense amplifier SA and an external device (e.g., a memory controller). The column decoder COL DEC may decode an externally inputted address and may select any one of the bit lines BL.

The control logic COL may generate control signals for controlling operations of writing or reading data to the memory cell array CAR.

Figure 20:
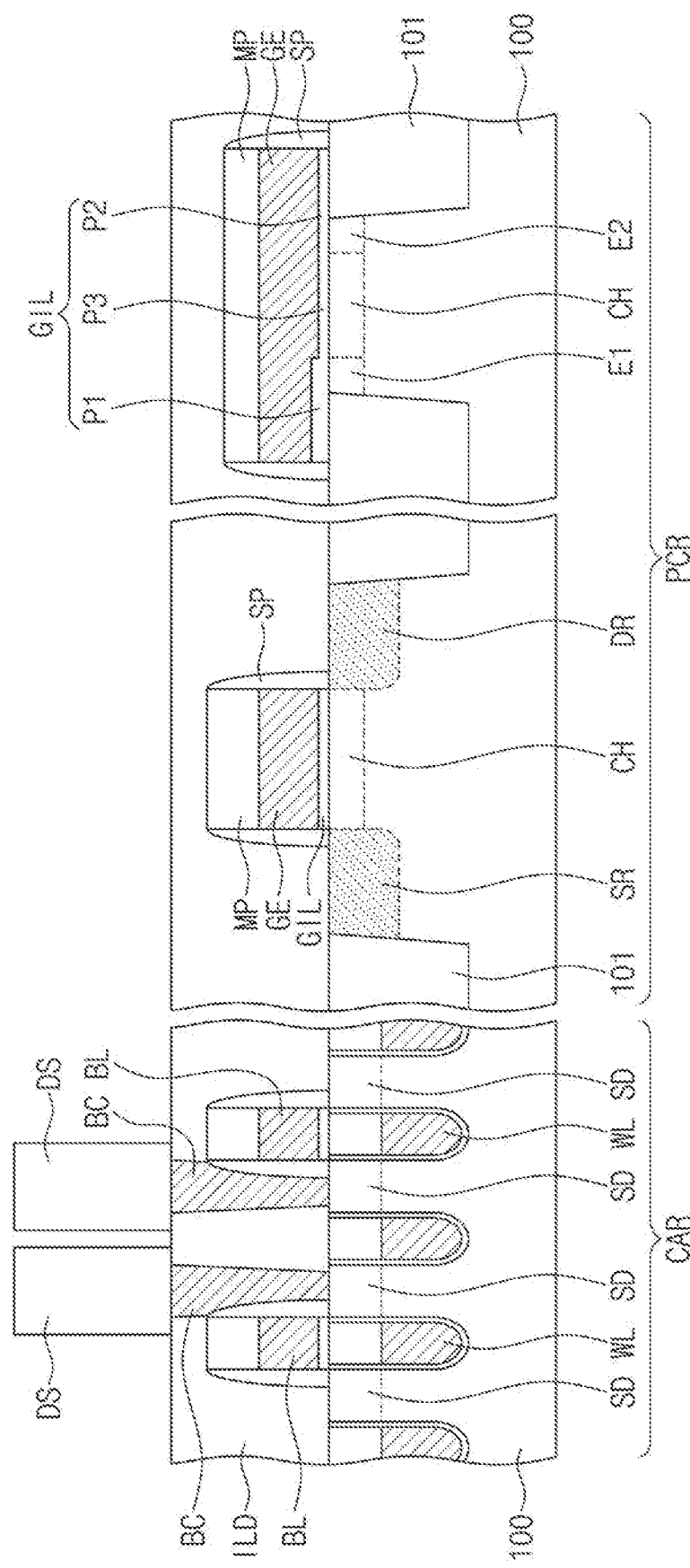
FIG. 20 is a cross-sectional view of a semiconductor memory device including a semiconductor device according to embodiments.

FIG. 20 is a cross-sectional view of a semiconductor memory device including a semiconductor device according to embodiments.

Referring to FIG. 20, a semiconductor substrate 100 may include a cell array region CAR and a peripheral circuit region PCR around the cell array region CAR.

According to embodiments, a memory cell array (refer to CAR in FIG. 19) including a plurality of memory cells (refer to MC in FIG. 19) disposed on the semiconductor substrate 100 of the cell array region CAR. The memory cell array CAR includes a plurality of memory cells MC and a plurality of word lines WL and bit lines BL that are electrically connected to the memory cells MC. According to an embodiment, each of the memory cells MC may include a data storage element DS. For example, the data storage element DS may be a capacitor including a lower electrode, an upper electrode, and a dielectric layer therebetween. Alternatively, the data storage element DS may include a variable resistance material that may be switched between two resistance states by an applied electric pulse. For example, the variable resistance element may include at least one magnetic material or a phase-change material whose crystal state changes depending on an amount of current. As another example, the data storage element may include perovskite compounds or transition metal oxides.

A peripheral circuit including row and column decoders (refer to ROW DEC and COL DEC in FIG. 19), sense amplifier (refer to SA in FIG. 19), a control logic (refer to COL in FIG. 19), and the like may be disposed on the semiconductor substrate 100 of the peripheral circuit region PCR. According to an embodiment, the peripheral circuit may include an MOS transistor, a resistor, and a capacitor electrically connected to the memory cell array (refer to CAR in FIG. 19).

In detail, the device isolation layer 101 defining cell active regions may be formed on the semiconductor substrate 100 of the cell array region CAR. Here, the cell active regions may have a bar shape, and long axes of the cell active regions may be disposed in a diagonal direction with respect to the word lines WL and the bit lines BL.

The word lines WL may be disposed across cell active regions. In an embodiment, the word lines WL may be formed in a recess region, which is recessed from a surface of the semiconductor substrate 100 and has a certain depth, with a gate insulating layer. Also, upper surfaces of the word lines WL may be located at a lower level than that of an upper surface of the semiconductor substrate 100, and an insulating material may be filled in the recess region in which the word lines WL are formed.

Cell source and drain regions SD may be formed in cell active regions on both sides of the word lines WL. The cell source and drain regions SD may be impurity regions doped with n-type or p-type impurities. In this way, as the word lines WL and the cell source and drain regions SD are formed, a plurality of MOS transistors may be formed on the semiconductor substrate 100.

The bit lines BL may be disposed across the word lines WL on the semiconductor substrate 100 of the cell array region CAR. The interlayer insulating layer may be interposed between the bit lines BL and the semiconductor substrate 100, and bit line contact plugs DC may penetrate the interlayer insulating layer to be connected to the cell source regions SD, thereby allowing the bit lines BL to be electrically connected to the cell source regions SD.

Buried contact plugs BC may be connected to the cell drain regions SD, respectively. Furthermore, the data storage element DS may be disposed on each of the buried contact plugs BC.

The device isolation layer 101 defining peripheral active regions may be provided on the semiconductor substrate 100 of the peripheral circuit region PCR.

A peripheral transistor may be provided on the peripheral active region. The peripheral transistor may include substantially the same features as the transistors described with reference to FIGS. 1 to 6.

As an example, a gate electrode GE may be disposed on the peripheral active region, and a gate insulating pattern GIL may be interposed between the gate electrode GE and the semiconductor substrate 100. Here, the gate insulating pattern GIL, as described above, may include a first edge portion P1 adjacent to a first sidewall of the device isolation layer 101 and a second edge portion P2 adjacent to a second sidewall of the device isolation layer 101, and thicknesses of the first and second edge portions P1 and P2 may be different from each other.

In addition, a channel region overlapping the gate electrode GE may include a first edge region E1, a second edge region E2, and an effective channel region CH.

According to embodiments, carriers may flow from a source to a drain during an operation of a transistor in a state of being separated from first and second sidewalls of a device isolation layer. That is, due to an asymmetric shape of an active region and thickness difference in a gate insulating pattern, and/or due to a gate length difference and the thickness difference in the gate insulating pattern described above, a current may flow more efficiently through an effective channel region corresponding to a center portion of a channel region of a transistor without the carriers of the current being trapped at an interface of the active region and a device isolation layer or an STI layer.

Accordingly, in the transistor provided in each pixel region of the image sensor, the noise due to the carriers being trapped at the interface between the active region and the device isolation layer may be reduced. Therefore, the electrical characteristics and the optical characteristics of the image sensor may be improved.

Although the inventive concepts have been described in reference to image sensor embodiments, application of the inventive concepts is not limited to image sensors and various different semiconductor devices may benefit from the present disclosure.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A semiconductor device comprising:
    a device isolation layer defining an active region on a semiconductor substrate;
    a gate electrode crossing the active region;
    a gate insulating pattern between the gate electrode and the semiconductor substrate;
    a first impurity region provided at a first side of the gate electrode and in the active region; and
    a second impurity region provided at a second side of the gate electrode and in the active region,
    wherein the first impurity region comprises a source region and the second impurity region comprises a drain region,
    wherein the gate insulating pattern comprises a first edge portion adjacent to a first sidewall of the device isolation layer, a second edge portion adjacent to a second sidewall of the device isolation layer, and a center portion between the first and second edge portions, and
    wherein the first edge portion has a first thickness, and the second edge portion has a second thickness smaller than the first thickness,
    wherein the first impurity region and the second impurity region are spaced from each other in a first direction,
    wherein the gate electrode extends along a second direction perpendicular to the first direction,
    wherein the first edge portion, the second edge portion, and the center portion are extended in the second direction, and wherein the first sidewall of the device isolation layer and the second sidewall of the device isolation layer are opposite to each other in the second direction.

2. The semiconductor device of claim 1, wherein the first edge portion and the second edge portion of the gate insulating pattern are spaced from each other in the second direction perpendicular to the first direction.

3. The semiconductor device of claim 1, wherein the active region comprises first portions spaced from each other in a first direction and a second portion between the first portions,
wherein the second portion of the active region comprises a first edge region adjacent to the first sidewall of the device isolation layer, a second edge region opposite to the first edge region and adjacent to the second sidewall of the device isolation layer, and an effective channel region between the first and second edge regions, and
wherein the first edge portion of the gate insulating pattern overlaps the first edge region, and the second edge portion of the gate insulating pattern overlaps the second edge region.

4. The semiconductor device of claim 1, wherein the center portion of the gate insulating pattern has a third thickness equal to the second thickness.

5. The semiconductor device of claim 1, wherein the gate electrode comprises a first portion having a first length and a second portion having a second length greater than the first length, and
wherein the second portion of the gate electrode protrudes to at least one of the first and second impurity regions.

6. The semiconductor device of claim 5, wherein the first portion of the gate electrode is disposed on the first edge portion of the gate insulating pattern, and the second portion of the gate electrode is disposed on the second edge portion of the gate insulating pattern.

7. The semiconductor device of claim 1, wherein the active region comprises a channel region overlapping the gate electrode,
wherein the channel region comprises a first edge region adjacent to the first sidewall of the device isolation layer, a second edge region adjacent to the second sidewall of the device isolation layer, and an effective channel region between the first and second edge regions,
wherein the first edge portion of the gate insulating pattern overlaps the first edge region, the second edge portion of the gate insulating pattern overlaps the second edge region, and
wherein a length of the second edge region is longer than a length of the first edge region.

8. The semiconductor device of claim 1, wherein the active region comprises undoped regions at both sides of the gate electrode,
wherein the first edge portion and the center portion of the gate insulating pattern are provided between the first and second impurity regions, and
wherein the second edge portion of the gate insulating pattern is provided between the undoped regions.

9. The semiconductor device of claim 1, wherein the first and second impurity regions are spaced from each other in a first direction,
wherein each of the first and second impurity regions comprises a first doped region and a second doped region adjacent to each other in a second direction perpendicular to the first direction, and
wherein, a width of the first doped region in the second direction is different from a width of the second doped region in the second direction.

10. The semiconductor device of claim 1, wherein the first and second impurity regions are spaced from each other in a first direction,
wherein each of the first and second impurity regions comprises a first doped region and a second doped region adjacent to each other in a second direction perpendicular to the first direction, and
wherein an impurity concentration of the first doped region is different from an impurity concentration of the second doped region.

11. The semiconductor device of claim 1, wherein the first and second impurity regions are spaced from each other in a first direction,
wherein each of the first and second impurity regions comprises a first doped region and a second doped region adjacent to each other in a second direction perpendicular to the first direction, and
wherein the first doped region comprises impurities of a first conductivity type, and the second doped region comprises impurities of a second conductivity type different from the first conductivity type.

12. An image sensor comprising:
a semiconductor substrate of a first conductivity type;
a pixel isolation structure provided in the semiconductor substrate to define a pixel region;
a device isolation layer provided in the semiconductor substrate of the pixel region to define an active region;
a photoelectric conversion region provided in the pixel region and comprising impurities of a second conductivity type;
a floating diffusion region spaced from the photoelectric conversion region and provided in the pixel region;
a transfer gate electrode between the photoelectric conversion region and the floating diffusion region; and
transistors connected to the floating diffusion region,
wherein at least one of the transistors comprises:
a gate electrode disposed on the active region;
a gate insulating pattern between the gate electrode and the active region; and
a first impurity region and a second impurity region provided in the active region at both sides of the gate electrode,
wherein the gate insulating pattern comprises a first edge portion and a second edge portion adjacent to the device isolation layer, and a center portion between the first and second edge portions,
wherein the first edge portion has a first thickness, and the second edge portion has a second thickness smaller than the first thickness,
wherein the first impurity region and the second impurity region are spaced from each other in a first direction,
wherein the first impurity region comprises a source region and the second impurity region comprises a drain region,
wherein the gate electrode extends along a second direction perpendicular to the first direction,
wherein the first edge portion, the second edge portion, and the center portion are extended in the second direction, and
wherein the first edge portion of the gate insulating pattern and the second edge portion of the gate insulating pattern are opposite to each other in the second direction.

13. The image sensor of claim 12, wherein the first edge portion and the center portion of the gate insulating pattern are provided between the first and second impurity regions in a first direction, and
    wherein the second edge portion of the gate insulating pattern is provided between portions of the device isolation layer in the first direction.

14. The image sensor of claim 12, wherein the gate electrode comprises a first portion having a first length and a second portion having a second length greater than the first length, and
    wherein the second portion of the gate electrode protrudes to at least one of the first and second impurity regions.

15. The image sensor of claim 14, wherein, in the gate insulating pattern, a length of the second edge portion is greater than a length of the first edge portion.

16. An image sensor comprising:
    a semiconductor substrate of a first conductivity type having a first surface and a second surface facing each other;
    a pixel isolation structure disposed in the semiconductor substrate to define first and second pixel regions;
    photoelectric conversion regions of a second conductivity type provided to the first and second pixel regions, respectively;
    a transfer gate electrode disposed on the first surface of the semiconductor substrate in each of the first and second pixel regions;
    a first device isolation layer defining a first active region on the first surface of the semiconductor substrate in the first pixel region;
    a source follower gate electrode disposed on the first active region;
    a first gate insulating pattern between the source follower gate electrode and the first active region;
    a first impurity region and a second impurity region provided in the first active region at both sides of the source follower gate electrode;
    interconnections electrically connected to the photoelectric conversion regions on the first surface of the semiconductor substrate;
    color filters corresponding to the first and second pixel regions on the second surface of the semiconductor substrate; and
    micro lenses on the color filters,
    wherein the first active region includes a channel region overlapping the source follower gate electrode, and the channel region comprises a first edge region adjacent to a first sidewall of the first device isolation layer, a second edge region adjacent to a second sidewall of the first device isolation layer, and an effective channel region between the first edge region and the second edge region,
    wherein the first gate insulating pattern comprises a first edge portion having a first thickness and overlapping the first edge region, and a second edge portion having a second thickness smaller than the first thickness and overlapping the second edge region,
    wherein the first impurity region and the second impurity region are spaced from each other in a first direction,
    wherein the first impurity region comprises a source region and the second impurity region comprises a drain region,
    wherein the source follower gate electrode extends along a second direction perpendicular to the first direction,
    wherein the first edge portion, the second edge portion, and the effective channel region are extended in the second direction, and
    wherein the first edge portion of the first gate insulating pattern and the second edge portion of the first gate insulating pattern are opposite to each other in the second direction.

17. The image sensor of claim 16, further comprising:
    a second device isolation layer defining a second active region on the first surface of the semiconductor substrate in the second pixel region;
    a reset gate electrode and a selection gate electrode spaced apart from each other on the second active region;
    a second gate insulating pattern between the reset gate electrode and the second active region; and
    a third gate insulating pattern between the selection gate electrode and the second active region,
    wherein at least one of the second and third gate insulating patterns comprises edge portions that are adjacent to the second device isolation layer and face each other, and the edge portions have different thicknesses.

\* \* \* \* \*